(12) United States Patent
Yu et al.

(10) Patent No.: US 9,337,220 B2
(45) Date of Patent: May 10, 2016

(54) SOLAR BLIND ULTRA VIOLET (UV) DETECTOR AND FABRICATION METHODS OF THE SAME

(71) Applicant: ZENA TECHNOLOGIES, INC., Cambridge, MA (US)

(72) Inventors: Young-June Yu, Cranbury, NJ (US); Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

(21) Appl. No.: 14/705,380

(22) Filed: May 6, 2015

(65) Prior Publication Data
US 2015/0236059 A1    Aug. 20, 2015

Related U.S. Application Data

(63) Continuation of application No. 14/487,375, filed on Sep. 16, 2014, now Pat. No. 9,054,008, which is a continuation of application No. 13/048,635, filed on Mar. 15, 2011, now Pat. No. 8,835,905.

(51) Int. Cl.
H01L 21/02        (2006.01)
H01L 27/146      (2006.01)
(Continued)

(52) U.S. Cl.
CPC ........... *H01L 27/14603* (2013.01); *B82Y 20/00* (2013.01); *B82Y 30/00* (2013.01); *B82Y 40/00* (2013.01); *F21V 9/08* (2013.01); *G02B 5/22* (2013.01); *G09F 13/00* (2013.01); *H01L 27/1446* (2013.01); *H01L 27/14607* (2013.01); *H01L 27/14629* (2013.01); *H01L 27/14692* (2013.01); *H01L 31/035227* (2013.01); *H01L 31/18* (2013.01); *B82Y 99/00* (2013.01); *Y10S 977/762* (2013.01); *Y10S 977/888* (2013.01);
(Continued)

(58) Field of Classification Search
CPC ................... H01L 27/14692; H01L 27/14629; H01L 31/035227; B82Y 40/00; B82Y 30/00
USPC .............. 257/21, 52, 184, 458, E33.076, 257/E31.121, E21.09, E29.003, E31.061; 438/5, 7, 16, 258
See application file for complete search history.

(56) References Cited

U.S. PATENT DOCUMENTS

| 1,918,848 A | 7/1933 | Land |
| 3,903,427 A | 9/1975 | Pack |

(Continued)

FOREIGN PATENT DOCUMENTS

| CN | 1624925 | 6/2005 |
| CN | 1306619 | 3/2007 |

(Continued)

OTHER PUBLICATIONS

Office Action for U.S. Appl. No. 14/450,812 mailed Jul. 23, 2015.
(Continued)

*Primary Examiner* — Yosef Gebreyesus
(74) *Attorney, Agent, or Firm* — Pillsbury Winthrop Shaw Pittman LLP

(57) ABSTRACT

Described herein is device configured to be a solar-blind UV detector comprising a substrate; a plurality of pixels; a plurality of nanowires in each of the plurality of pixel, wherein the plurality of nanowires extend essentially perpendicularly from the substrate.

26 Claims, 25 Drawing Sheets

(51) Int. Cl.

| | |
|---|---|
| *B82Y 20/00* | (2011.01) |
| *B82Y 30/00* | (2011.01) |
| *B82Y 40/00* | (2011.01) |
| *H01L 31/0352* | (2006.01) |
| *F21V 9/08* | (2006.01) |
| *G02B 5/22* | (2006.01) |
| *H01L 31/18* | (2006.01) |
| *G09F 13/00* | (2006.01) |
| *H01L 27/144* | (2006.01) |
| *B82Y 99/00* | (2011.01) |

(52) U.S. Cl.
CPC ....... *Y10S 977/954* (2013.01); *Y10T 428/24174* (2015.01); *Y10T 428/24893* (2015.01)

(56) References Cited

U.S. PATENT DOCUMENTS

| | | | |
|---|---|---|---|
| 4,017,332 A | 4/1977 | James | |
| 4,292,512 A | 9/1981 | Miller | |
| 4,316,048 A | 2/1982 | Woodall | |
| 4,357,415 A | 11/1982 | Hartman | |
| 4,387,265 A | 6/1983 | Dalal | |
| 4,394,571 A | 7/1983 | Jurisson | |
| 4,400,221 A | 8/1983 | Rahilly | |
| 4,443,890 A | 4/1984 | Eumurian | |
| 4,513,168 A | 4/1985 | Borden | |
| 4,531,055 A | 7/1985 | Shepherd, Jr. | |
| 4,620,237 A | 10/1986 | Traino | |
| 4,678,772 A | 7/1987 | Segal | |
| 4,827,335 A | 5/1989 | Saito | |
| 4,846,556 A | 7/1989 | Haneda | |
| 4,857,973 A | 8/1989 | Yang | |
| 4,876,586 A | 10/1989 | Dyck | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |
| 4,990,988 A | 2/1991 | Lin | |
| 5,071,490 A | 12/1991 | Yokota | |
| 5,081,049 A | 1/1992 | Green | |
| 5,096,520 A | 3/1992 | Faris | |
| 5,124,543 A | 6/1992 | Kawashima | |
| 5,217,911 A | 6/1993 | Denda | |
| 5,247,349 A | 9/1993 | Olego | |
| 5,272,518 A | 12/1993 | Vincent | |
| 5,311,047 A | 5/1994 | Chang | |
| 5,347,147 A | 9/1994 | Jones | |
| 5,362,972 A | 11/1994 | Yazawa | |
| 5,374,841 A | 12/1994 | Goodwin | |
| 5,391,896 A | 2/1995 | Wanlass | |
| 5,401,968 A | 3/1995 | Cox | |
| 5,449,626 A | 9/1995 | Hezel | |
| 5,468,652 A | 11/1995 | Gee | |
| 5,602,661 A | 2/1997 | Schadt | |
| 5,612,780 A | 3/1997 | Rickenbach | |
| 5,671,914 A | 9/1997 | Kalkhoran | |
| 5,696,863 A | 12/1997 | Kleinerman | |
| 5,723,945 A | 3/1998 | Schermerhorn | |
| 5,747,796 A | 5/1998 | Heard | |
| 5,767,507 A | 6/1998 | Uenlue | |
| 5,798,535 A | 8/1998 | Huang | |
| 5,844,290 A | 12/1998 | Furumiya | |
| 5,853,446 A | 12/1998 | Carre | |
| 5,857,053 A | 1/1999 | Kane | |
| 5,872,365 A * | 2/1999 | Goh | ............ G03F 7/0691 250/492.1 |
| 5,877,492 A | 3/1999 | Fujieda | |
| 5,880,495 A | 3/1999 | Chen | |
| 5,885,881 A | 3/1999 | Ojha | |
| 5,900,623 A | 5/1999 | Tsang | |
| 5,943,463 A | 8/1999 | Unuma | |
| 5,968,528 A | 10/1999 | Deckner | |
| 6,013,871 A | 1/2000 | Curtin | |
| 6,033,582 A | 3/2000 | Lee | |
| 6,037,243 A | 3/2000 | Ha | |
| 6,046,466 A | 4/2000 | Ishida | |
| 6,074,892 A | 6/2000 | Bowers | |
| 6,100,551 A | 8/2000 | Lee | |
| H1939 H * | 2/2001 | Geller | ..................... 250/339.05 |
| 6,270,548 B1 | 8/2001 | Campbell | |
| 6,301,420 B1 | 10/2001 | Greenaway | |
| 6,326,649 B1 | 12/2001 | Chang | |
| 6,388,243 B1 | 5/2002 | Berezin | |
| 6,388,648 B1 | 5/2002 | Clifton | |
| 6,407,439 B1 | 6/2002 | Hier | |
| 6,459,034 B2 | 10/2002 | Muramoto | |
| 6,463,204 B1 | 10/2002 | Ati | |
| 6,542,231 B1 | 4/2003 | Garrett | |
| 6,563,995 B2 | 5/2003 | Keaton | |
| 6,566,723 B1 | 5/2003 | Vook | |
| 6,680,216 B2 | 1/2004 | Kwasnick | |
| 6,709,929 B2 | 3/2004 | Zhang | |
| 6,720,594 B2 | 4/2004 | Rahn | |
| 6,771,314 B1 | 8/2004 | Bawolek | |
| 6,805,139 B1 | 10/2004 | Savas | |
| 6,812,473 B1 | 11/2004 | Amemiya | |
| 6,904,187 B2 | 6/2005 | Fischer et al. | |
| 6,927,145 B1 | 8/2005 | Yang | |
| 6,960,526 B1 | 11/2005 | Shah | |
| 6,967,120 B2 | 11/2005 | Jang | |
| 6,969,899 B2 | 11/2005 | Yaung | |
| 6,987,258 B2 | 1/2006 | Mates | |
| 6,992,298 B2 * | 1/2006 | Nayfeh | .................. B82Y 30/00 250/372 |
| 6,996,147 B2 | 2/2006 | Majumdar | |
| 7,052,927 B1 | 5/2006 | Fletcher | |
| 7,064,372 B2 | 6/2006 | Duan | |
| 7,105,428 B2 | 9/2006 | Pan | |
| 7,106,938 B2 | 9/2006 | Baek et al. | |
| 7,109,517 B2 | 9/2006 | Zaidi | |
| 7,153,720 B2 | 12/2006 | Augusto | |
| 7,163,659 B2 | 1/2007 | Stasiak | |
| 7,192,533 B2 | 3/2007 | Bakkers | |
| 7,208,783 B2 | 4/2007 | Palsule | |
| 7,230,286 B2 | 6/2007 | Cohen | |
| 7,235,475 B2 | 6/2007 | Kamins | |
| 7,241,434 B2 | 7/2007 | Anthony | |
| 7,253,017 B1 | 8/2007 | Roscheisen | |
| 7,254,151 B2 | 8/2007 | Lieber | |
| 7,262,400 B2 | 8/2007 | Yaung | |
| 7,265,328 B2 | 9/2007 | Mouli | |
| 7,272,287 B2 | 9/2007 | Bise | |
| 7,285,812 B2 | 10/2007 | Tang | |
| 7,306,963 B2 | 12/2007 | Linden | |
| 7,307,327 B2 | 12/2007 | Bahl | |
| 7,311,889 B2 | 12/2007 | Awano | |
| 7,326,915 B2 | 2/2008 | Kaluzhny | |
| 7,330,404 B2 | 2/2008 | Peng | |
| 7,335,962 B2 | 2/2008 | Mouli | |
| 7,336,860 B2 | 2/2008 | Cyr | |
| 7,339,110 B1 | 3/2008 | Mulligan et al. | |
| 7,358,583 B2 | 4/2008 | Reznik | |
| 7,381,966 B2 | 6/2008 | Starikov | |
| 7,388,147 B2 | 6/2008 | Mulligan | |
| 7,416,911 B2 | 8/2008 | Heath | |
| 7,446,025 B2 | 11/2008 | Cohen | |
| 7,462,774 B2 | 12/2008 | Roscheisen | |
| 7,471,428 B2 | 12/2008 | Ohara | |
| 7,491,269 B2 | 2/2009 | Legagneux | |
| 7,507,293 B2 | 3/2009 | Li | |
| 7,521,322 B2 | 4/2009 | Tang | |
| 7,524,694 B2 | 4/2009 | Adkisson | |
| 7,582,857 B2 | 9/2009 | Gruev | |
| 7,598,482 B1 | 10/2009 | Verhulst | |
| 7,622,367 B1 | 11/2009 | Nuzzo | |
| 7,626,685 B2 | 12/2009 | Jin | |
| 7,646,138 B2 | 1/2010 | Williams | |
| 7,646,943 B1 | 1/2010 | Wober | |
| 7,647,695 B2 | 1/2010 | MacNutt | |
| 7,649,665 B2 | 1/2010 | Kempa | |
| 7,655,860 B2 | 2/2010 | Parsons | |
| 7,663,202 B2 | 2/2010 | Wang | |

(56) References Cited

U.S. PATENT DOCUMENTS

| | | |
|---|---|---|
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,888,155 B2 | 2/2011 | Chen |
| 7,902,540 B2 | 3/2011 | Cohen |
| 7,948,555 B2 | 5/2011 | Kwon et al. |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu |
| 8,330,090 B2 | 12/2012 | Agarwal |
| 8,384,007 B2 | 2/2013 | Yu |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1* | 8/2003 | Vispute .......... H01L 31/022408 250/372 |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1* | 2/2004 | Empedocles ......... H01L 29/165 257/14 |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |

(56) References Cited

U.S. PATENT DOCUMENTS

| | | |
|---|---|---|
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278476 A1* | 12/2007 | Black ............... B82Y 10/00 257/14 |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1* | 12/2010 | Dutta ............... H01L 25/042 257/21 |
| 2011/0018424 A1 | 1/2011 | Takada |

(56) References Cited

U.S. PATENT DOCUMENTS

| | | |
|---|---|---|
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman et al. |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100350429 | 11/2007 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 A | 5/2002 |
| JP | 2005252210 A | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | 8603347 A1 | 6/1986 |
| WO | 0002379 | 1/2000 |
| WO | 02069623 | 9/2002 |
| WO | 03107439 A1 | 12/2003 |
| WO | 2005064337 | 7/2005 |
| WO | 2007000879 | 1/2007 |
| WO | 2008069565 | 6/2008 |
| WO | 2008079076 | 7/2008 |
| WO | 2008079076 A1 | 7/2008 |
| WO | 2008131313 A2 | 10/2008 |
| WO | 2008135905 | 11/2008 |
| WO | 2008135905 A2 | 11/2008 |
| WO | 2008135905 A3 | 11/2008 |
| WO | 2008143727 A2 | 11/2008 |
| WO | 2008131313 | 12/2008 |
| WO | 2009099841 | 8/2009 |
| WO | 2009116018 A2 | 9/2009 |
| WO | 2009137241 A2 | 11/2009 |
| WO | 2010019887 A1 | 2/2010 |
| WO | 2010039631 A1 | 4/2010 |
| WO | 2011074457 | 6/2011 |

OTHER PUBLICATIONS

Office Action for U.S. Appl. No. 14/293,164 mailed Aug. 14, 2015.
Office Action issued Jul. 9, 2015 in Taiwanese Application No. 102124069.
A. Gu et al., "Design and growth of III—V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action issued Aug. 12, 2015 in Chinese Application No. 201180054442.9.
Office Action mailed Sep. 30, 2015 in Japanese Application No. 2014-094365.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,812 mailed Oct. 28, 2015.
Office Action for U.S. Appl. No. 12/945,429 mailed Sep. 4, 2015.
Office Action dated Oct. 6, 2015 in Taiwanese Application No. 100141376.

(56) References Cited

OTHER PUBLICATIONS

Office Action dated Sep. 11, 2015 in Taiwanese Application No. 103143553.
International Search Report and Written Opinion mailed Nov. 27, 2015 in International Application No. PCT/US2015/038999.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
CMOS image sensor pixel microlens array optimization using FDTD Solutions, http://www.lumerical_com/fdtd_microlens/cmos_image_sensor_pixel_microlens.php, pp. 1-2, Jun. 25, 2008.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.
Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
CMOS image sensor pixel optical efficiency and optical crosstalk optimization using FDTD Solutions www.lumerical.com/fdtd_microlens/cmos_image_sensor_pixel_microlens.php, Mar. 19, 2009.
Baomin, et al., Nanotechology 23 (2012) 194003, 7 pages.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Office Action issued May 15, 2015 in U.S. Appl. No. 14/274,448.
Office Action for U.S. Appl. No. 12/982,269 mailed May 22, 2015.
Babinec et al., High-Flux, Low-Power Diamond Nanowire Single-Photon Source Arrays: An Enabling Material for Optical and Quantum Computing and Cryptography, obtained on Jul. 22, 2010 at URL:http://otd.harvard.edu/technologies/tech.php?case=3702.
Chung, Sung-Wook et al. Silicon Nanowire Devices. Applied Physics Letters, vol., 76, No. 15 (Apr. 10, 2000), pp. 2068-2070.
CMOS image sensor pixel optical efficiency and optical crosstalk optimization using FDTD Solutions' www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, vol. 19, No. 25. 2008.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumee, et al.; Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
Hsu, et al. 'Light Guide for Pixel Crosstalk Improvement in Deep Submicron CMOS Image Sensor'; IEEE Electron Device Letters, vol. 25, No. 1, Jan. 2004.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/057227, mailed Jan. 26, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.

(56) References Cited

OTHER PUBLICATIONS

International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
Jin-Kon Kim; 'New Functional Nanomaterials Based on Block Copolymers' http://www.ziu.edu.cn/adver/subjectizyhd/jz0707061313.html, Jul. 11, 2007.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Doping Silicon, Meeting Abstract 943, 217th ECS Meeting MP2010-O1 , Apr. 25-30, 2010 Vancouver Canada, El-Advanced Gate Stack, Source / Drain, and Channel Engineering for Si-Based CMOS 6: New Materials, Processes and Equipment.
Kane, Why Nanowires Make Great Photodetectors, EurekAlert.com article, Apr. 25, 2007.
Kempa, Thomas J. et al. Single and Tandem Axial p—i—n. Nanowire Photovoltaic Devices, Nano Letters, 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law et al., Semiconductor Nanowires and Nanotubes, Annu. Rev. Mater. Res., 2004, vol. 34, pp. 83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector technology, Scientific Technology, Scientific Detector Workshop, Sicily 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., Press, 2002, pp. 125-204. CRC.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N. L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, dowwnloaded Jun. 4, 2009.
Rosfjord et al., Nanowire Single-Photon Detector with an Integrated Optical Cavity and Anti-Reflection Coating, Optics Express: The International Electronic Journal of Optics; Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sarkar et al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Shockley, et al., Detailed Balance Limit of Efficiency of p—n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. Crosstalk improvement technology applicable to 0.14m CMOS image sensor; IEEE International Electron Devices Meeting, Dec. 13-15, 2004; IEDM Technical Digest, pp. 997-1000.
Verheijen, Marcel A. et al. Growth Kinetics of Heterostructured GaP-GaAs Nanowires. J. Am, Chem. Soc. 2006, 128, 1353-1359.
Wagner et al., Vapor-Liquid-Solid Mechanism of Single Crystal Growth, Applied Physics Letters, Mar. 1, 1964, vol. 4, No. 5, pp. 89-90.
Wang, Introduction to Nanotechnology—Where Opportunities arise & Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.

(56) References Cited

OTHER PUBLICATIONS

International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
Office Action issued on Mar. 3, 2014 in Chinese Application No. 200980142671.9.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/573,582, dated Jun. 28, 2012.
U.S. Office Action for U.S. Appl. No. 13/494,661, notification date Nov. 7, 2012.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectrolQ, vol. 47, Issue 7.
International Preliminary Search Report on Patentability of PCT/US2011/057325, mailed May 2, 2013 (9 pages).
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
Taiwanese Office Action of Taiwan Patent Application No. 099116881, issued Jul. 18, 2013 (8 pages).
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
Office Action issued on Jun. 19, 2014 in Taiwanese Application No. 099133891.
U.S. Office Action for U.S. Appl. No. 12/945,492 mailed May 13, 2014.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
U.S. Office Action for U.S. Appl. No. 14/021,672 mailed May 9, 2014.
U.S. Office Action for U.S. Appl. No. 12/633,313 mailed Aug. 1, 2014.
U.S. Office Action for U.S. Appl. No. 13/693,207 mailed Oct. 9, 2014.
U.S. Office Action for U.S. Appl. No. 12/966,514 mailed Sep. 23, 2014.
Office Action issued on Jun. 24, 2014 in Taiwanese Application No. 098129911.
University of California San Diego, Class ECE 183 Lab 1, 2013.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
Notice of Allowance issued on Dec. 1, 2014 in U.S. Appl. No. 12/910,664.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/982,269, mailed Jan. 15, 2015.
Office Action for U.S. Appl. No. 12/945,492 mailed Jan. 16, 2015.
Office Action for U.S. Appl. No. 13/963,847 mailed Mar. 12, 2015.
Office Action for U.S. Appl. No. 12/966,514 mailed Mar. 10, 2015.
Office Action issued on Jan. 16, 2015 in Chinese Application No. 201180054442.9.
Bernstein et al. "Modern Physics", Chapter 14, Section 6, pp. 420-421, 2000 by Prentice-Hall Inc.
Office Action issued Feb. 23, 2015 in U.S. Appl. No. 13/925,429.
Office Action issued on Mar. 4, 2015 in U.S. Appl. No. 13/556,041.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Feb. 4, 2016 in U.S. Appl. 14/274,448.
Office Action issued Mar. 7, 2016 in U.S. Appl. 14/450,812.
Office Action issued Feb. 25, 2016 in Chinese Application No. 201180051048.X.
Office Action issued Feb. 1, 2016 in Taiwanese Application 102124069.

(56) References Cited

OTHER PUBLICATIONS

Office Action issued Feb. 6, 2016 in Chinese Application No. 201180054442.9.

Office Action mailed Mar. 29, 2016 in Japanese Application No. 2014-138265.

International Preliminary Report on Patentability issued on Mar. 22, 2016 in International Application PCT/US2014/056558.

* cited by examiner

1005

1006

1007

1008

1009

1025

242

1026

243

1027

1028

2005

2006

2007

2008

2009

2010

2011

2012

2013

2014

2015

2016

2017

2018

3005

3006

3007

3008

3009

423

3010

434

3011

3012

3013

3014

3015

3016

3017

3018

3019

3020

3021

US 9,337,220 B2

SOLAR BLIND ULTRA VIOLET (UV) DETECTOR AND FABRICATION METHODS OF THE SAME

CROSS-REFERENCE TO RELATED APPLICATIONS

This application is a continuation of U.S. application Ser. No. 14/487,375 filed Sep. 16, 2014, which is a continuation of Ser. No. 13/048,635 filed Mar. 15, 2011 (now U.S. Pat. No. 8,835,905 issued on Sep. 16, 2014). This application is related to the disclosures of U.S. patent application Nos. 12/204,686, filed Sep. 4, 2008 (now U.S. Pat. No. 7,646,943, issued Jan. 12, 2010), Ser. No. 12/648,942, filed Dec. 29, 2009 (now U.S. Pat. No. 8,229,255, issued Jul. 24, 2012), Ser. No. 13/556,041, filed Jul. 23, 2012, Ser. No. 12/270,233, filed Nov. 13, 2008 (now U.S. Pat. No. 8,274,039, issued Sep. 25, 2012), Ser. No. 13/925,429, filed Jun. 24, 2013, Ser. No. 13/570,027, filed Aug. 8, 2012 (now U.S. Pat. No. 8,471,190, issued Jun. 25, 2013), Ser. No. 12/472,264, filed May 26, 2009 (now U.S. Pat. No. 8,269,985, issued Sep. 18, 2012), Ser. No. 13/621,607, filed Sep. 17, 2012 (now U.S. Pat. No. 8,514,411, issued Aug. 20, 2013), Ser. No. 13/971,523, filed Aug. 20, 2013 (now U.S. Pat. No. 8,810,808, issued Aug. 19, 2014), Ser. No. 12/472,271, filed May 26, 2009 (now abandoned), Ser. No. 12/478,598, filed Jun. 4, 2009 (now U.S. Pat. No. 8,546,742, issued Oct. 1, 2013), Ser. No. 14/021,672, filed Sep. 9, 2013, Ser. No. 12/573,582, filed Oct. 5, 2009 (now U.S. Pat. No. 8,791,470, issued Jul. 29, 2014), Ser. No. 14/274,448, filed May 9, 2014, Ser. No. 12/575,221, filed Oct. 7, 2009 (now U.S. Pat. No. 8,384,007, issued Feb. 26, 2013), Ser. No. 12/633,323, filed Dec. 8, 2009 (now U.S. Pat. No. 8,735,797, issued May 27, 2014), Ser. No. 14/068,864, filed Oct. 31, 2013, Ser. No. 14/281,108, filed May 19, 2014, Ser. No. 13/494,661, filed Jun. 12, 2012 (now U.S. Pat. No. 8,754,359, issued Jun. 17, 2014), Ser. No. 12/633,318, filed Dec. 8, 2009 (now U.S. Pat. No. 8,519,379, issued Aug. 27, 2013), Ser. No. 13/975,553, filed Aug. 26, 2013 (now U.S. Pat. No. 8,710,488, issued Apr. 29, 2014), Ser. No. 12/633,313, filed Dec. 8, 2009, Ser. No. 12/633,305, filed Dec. 8, 2009 (now U.S. Pat. No. 8,299,472, issued Oct. 30, 2012), Ser. No. 13/543,556, filed Jul. 6, 2012 (now U.S. Pat. No. 8,766,272, issued Jul. 1, 2014), Ser. No. 14/293,164, filed Jun. 2, 2014, Ser. No. 12/621,497, filed Nov. 19, 2009 (now abandoned), Ser. No. 12/633,297, filed Dec. 8, 2009 (now U.S. Pat. No. 8,889,455, issued Nov. 18, 2014), Ser. No. 12/982,269, filed Dec. 30, 2010, Ser. No. 12/966,573, filed Dec. 13, 2010 (now U.S. Pat. No. 8,866,065, issued Oct. 21, 2014), Ser. No. 12/967,880, filed Dec. 14, 2010 (now U.S. Pat. No. 8,748,799, issued Jun. 10, 2014), Ser. No. 14/291,888, filed May 30, 2014 Ser. No. 12/966,514, filed Dec. 13, 2010, Ser. No. 12/974,499, filed Dec. 21, 2010 (now U.S. Pat. No. 8,507,840, issued Aug. 13, 2013), Ser. No. 12/966,535, filed Dec. 13, 2010 (now U.S. Pat. No. 8,890,271, issued Nov. 18, 2014), Ser. No. 12/910,664, filed Oct. 22, 2010 (now U.S. Pat. No. 9,000,353 issued Apr. 7, 2015), Ser. No. 12/945,492, filed Nov. 12, 2010, Ser. No. 13/047,392, filed Mar. 14, 2011 (now U.S. Pat. No. 8,835,831, issued Sep. 16, 2014), Ser. No. 14/450,812, filed Aug. 4, 2014, Ser. No. 13/106,851, filed May 12, 2011, Ser. No. 13/288,131, filed Nov. 3, 2011, Ser. No. 14/334,848, filed Jul. 18, 2014, Ser. No. 14/032,166, filed Sep. 19, 2013, Ser. No. 13/543,307, filed Jul. 6, 2012, Ser. No. 13/963,847, filed Aug. 9, 2013, Ser. No. 13/693,207, filed Dec. 4, 2012, 61/869,727, filed Aug. 25, 2013, Ser. No. 14/322,503, filed Jul. 2, 2014, and Ser. No. 14/311,954, filed Jun. 23, 2014, Ser. No. 14/459,398, filed Aug. 14, 2014, Ser. No. 14/501,983 filed Sep. 30, 2014, Ser. No. 14/503,598, filed Oct. 1, 2014, Ser. No. 14/516,162, filed Oct. 16, 2014, Ser. No. 14/563,781, filed Dec. 8, 2014 are each hereby incorporated by reference in their entirety.

BACKGROUND

The ozone layer of the Earth atmosphere strongly absorbs ultra violet (UV) radiations in the 300 nm to 200 nm wavelength region. Therefore, below the ozone layer, which is mainly located in the lower portion of the stratosphere from approximately 13 to 40 kilometres above Earth surface, UV radiations from the sun in the 300 nm to 200 nm wavelength region are essentially absent.

To be able to reject the visible wavelengths and to detect the solar blind UV (SBUV) light, wide band-gap materials such as AlGaN, SiC, ZnO have often been used in SBUV detectors. All of these materials are difficult to grow, not compatible with conventional semiconductor processing, and are difficult for integrate with silicon-based readout electronics.

On the other hand, to increase sensitivity of an SBUV detector, an avalanche multiplication is often implemented by using the avalanche photodiode (APD) structure. For most of direct band-gap compound materials, however, multiplication noise also increases at the same rate as the avalanche gain due to the almost unity ratio of the hole to electron impact ionization coefficients.

An APD is a highly sensitive semiconductor electronic device that exploits the photoelectric effect to convert light to electricity. APDs can be thought of as photodetectors that provide a built-in first stage of gain through avalanche breakdown. By applying a high reverse bias voltage (typically 100-200 V in silicon), APDs show an internal current gain (around 100). Avalanche breakdown is a phenomenon that can occur in both insulating and semiconducting materials. It is a form of electric current multiplication that can allow very large currents to flow within materials which are otherwise good insulators. It is a type of electron avalanche. The avalanche process occurs when the carriers in the transition region are accelerated by the electric field to energies sufficient to free electron-hole pairs via collisions with bond electrons.

SUMMARY

According to an embodiment, a device comprises a substrate; a plurality of pixels; a plurality of nanowires in each of the plurality of pixel, wherein the plurality of nanowires extend essentially perpendicularly from the substrate, wherein the plurality of nanowires extend essentially perpendicularly from the substrate, and the device is configured to be a solar-blind UV detector to detect UV radiation in the solar-blind UV region.

According to an embodiment, the plurality of nanowires are configured to react only to radiations in the solar-blind UV region.

According to an embodiment, each of the plurality of nanowires comprises a core and a cladding surrounding the core, wherein the core has a higher refractive index than the cladding.

According to an embodiment, each of the plurality of the nanowires comprises a coupler disposed on an end of each of the nanowire away from the substrate, the coupler being functional to guide radiation into the nanowires.

According to an embodiment, the nanowires have a diameter from about 5 nm to about 30 nm, a height from about 0.1 µm to about 5 µm; the cladding has a thickness of about 10 nm to about 200 nm. According to an embodiment, the nanowires have a diameter from about 5 nm to about 150 nm.

According to an embodiment, the nanowires have a pitch from about 0.2 μm to about 2 μm.

According to an embodiment, the nanowires detect UV radiation in the solar-blind UV region by converting UV radiation in the solar-blind UV region to an electrical signal.

According to an embodiment, the solar-blind UV detector further comprises electrical components configured to detect the electrical signal.

According to an embodiment, the solar-blind UV detector is functional to detect the electrical signal from the nanowires in different pixels separately.

According to an embodiment, each of the nanowires comprises a photodiode or forms a photodiode with the substrate, wherein the avalanche photodiode is functional to convert at least a portion of UV radiation in the solar-blind UV region impinged on the nanowires. According to an embodiment, the photodiode can be an avalanche photodiode.

According to an embodiment, each of the nanowires comprises a first heavily doped semiconductor layer, a lightly doped semiconductor layer or an intrinsic semiconductor layer, a second heavily doped semiconductor layer, and a metal silicide layer; wherein the first heavily doped semiconductor layer is disposed on the lightly doped semiconductor layer or the intrinsic semiconductor layer; the lightly doped semiconductor layer or the intrinsic semiconductor layer is disposed on the second heavily doped semiconductor layer; the second heavily doped semiconductor layer is disposed on the metal silicide layer; the metal silicide layer is disposed on the substrate; the first heavily doped semiconductor layer is of an opposite type from the second heavily doped semiconductor layer; and wherein the first heavily doped semiconductor layer, the lightly doped semiconductor layer or the intrinsic semiconductor layer, and the second heavily doped semiconductor layer form the photodiode. An intrinsic semiconductor, also called an undoped semiconductor or i-type semiconductor, is a substantially pure semiconductor without any significant dopant species present. A heavily doped semiconductor is a semiconductor with such a high doping level that the semiconductor starts to behave electrically more like a metal than as a semiconductor. A lightly doped semiconductor is a doped semiconductor but not have a doping level as high as a heavily doped semiconductor. In a lightly doped semiconductor, dopant atoms create individual doping levels that can often be considered as localized states that can donate electrons or holes by thermal promotion (or an optical transition) to the conduction or valence bands respectively. At high enough impurity concentrations (i.e. heavily doped) the individual impurity atoms may become close enough neighbors that their doping levels merge into an impurity band and the behavior of such a system ceases to show the typical traits of a semiconductor, e.g. its increase in conductivity with temperature.

According to an embodiment, the solar-blind UV detector further comprises a common electrode disposed on and electrically connected to ends of all the nanowires, wherein the common electrode is substantially transparent to UV radiation in the solar-blind UV region.

According to an embodiment, the common electrode is made of graphene.

According to an embodiment, space between the nanowires is filled with an oxide layer.

According to an embodiment, the solar-blind UV detector further comprises a metal grid on the common electrode, the metal grid configured to provide mechanical support for the common electrode.

According to an embodiment, each of the nanowires comprises a core of lightly doped semiconductor, an intermediate shell of intrinsic semiconductor and an outer shell of doped semiconductor; wherein the intermediate shell is conformally disposed over the core; the outer shell is conformally disposed over the intermediate shell; the outer shell is of an opposite type from the core; and the outer shell, the intermediate shell and the core form the photodiode.

According to an embodiment, each nanowire further comprises a heavily doped semiconductor layer of the same type as the core, and a metal silicide layer; wherein the heavily doped semiconductor layer and a metal silicide layer are sandwiched between the core and the substrate; the intermediate shell and the outer shell do not contact the heavily doped semiconductor layer and the metal silicide layer; and the metal silicide layer is in contact with the substrate and forms electrical contact to the substrate.

According to an embodiment, a solar-blind image sensor comprises the solar-blind UV detector above and electronic circuitry functional to detect electrical signals generated by the nanowires of the solar-blind UV detector.

According to an embodiment, the electronic circuitry comprises a high voltage supply.

According to an embodiment, a method of fabricating an image sensor comprising a substrate, a plurality of pixels, a plurality of nanowires in each of the plurality of pixel, wherein the plurality of nanowires extend essentially perpendicularly from the substrate; the method comprises bonding the plurality of nanowires onto the substrate. The term "image sensor" as used herein means a device that converts an optical image to an electric signal. An image sensor can be used in digital cameras and other imaging devices. Examples of image sensors include a charge-coupled device (CCD) or a complementary metal-oxide-semiconductor (CMOS) active pixel sensor.

According to an embodiment, the method further comprises conducting lithography, ion implantation, annealing, evaporation, atomic layer deposition, chemical vapor deposition, dry etch or a combination thereof.

According to an embodiment, the image sensor is a solar-blind UV detector or a color image sensor. The term "color image sensor" as used herein means an image sensor capable of converting an optical image in the visible spectrum (i.e. a color image) to an electric signal.

DETAILED DESCRIPTION

In the following detailed description, reference is made to the accompanying drawings, which form a part thereof. In drawings, similar symbols typically identify similar components, unless the context dictates otherwise. The illustrate embodiments described in the detailed description, drawings, and claims are not meant to be limiting. Other embodiments may be utilized, and other changes may be made, without departing from the spirit or scope of the subject matter presented here.

This disclosure is drawn to, among other things, methods of use, methods of fabrication, apparatuses, systems, and devices related to an SBUV detector for detecting UV radiation in the solar-blind UV region. The SBUV region is the range of wavelengths in which the earth atmosphere absorbs essentially all UV radiation from the sun to the earth. For example, the wavelength region of 300 nm to 200 nm is within the SBUV region. A device that detects radiation only in the SBUV region and rejects visible and infrared radiation is called an SBUV detector or an SBUV sensor.

Sunlight does not interfere or blind a SBUV detector of the embodiments herein. Therefore, the SBUV detector of the embodiments herein is particularly useful for detecting manmade radiation sources that emit in the SBUV region and enjoys a very low false alarm rate. Such manmade radiation sources can include exhaust plumes of shoulder launched surface to air missiles (SLSAM), fire and flame, or any other UV emitting source including hydrogen flames. An SBUV detector of the embodiments herein can function at all lightning conditions including full daylight, without interference from the solar radiation and with very high signal to background ratio.

According to an embodiment, the SBUV detector comprises a substrate having a plurality of regions defined thereon (hereafter referred to as "pixels"). In each pixel, the SBUV detector comprises a plurality of nanowires extending essentially perpendicularly from the substrate. The term "nanowire" used herein means a structure whose dimension in a direction perpendicular to the substrate (hereafter referred to as the "normal direction") is substantially greater than dimensions of the structure in any direction perpendicular to the normal direction (hereafter referred to as a "transverse direction") and the dimensions in the transverse directions are less than 1000 nm. The plurality of nanowires can be equally or unequally spaced from each other, arranged in a regular array or in random. The plurality of nanowires are configured to react only to radiations in the SBUV region and not to react to radiations outside the SBUV region. Here, the term "react" is meant to broadly encompass absorbing, reflecting, coupling to, detecting, interacting with, converting to electrical signals, etc.

Figure 1A:
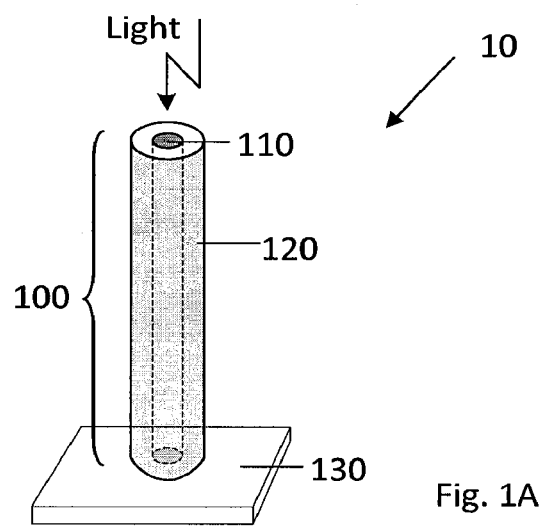
FIG. 1A shows one of the plurality of nanowires on a substrate.

FIG. 1A shows one of the plurality of nanowires 100 on an SBUV detector 10. For brevity, only one nanowires is shown but the SBUV detector 10 can comprise a plurality of nanowires 100, such as more than 1000, or more than 1000000. The nanowires 100 extend essentially perpendicularly from a substrate 130. Each of the nanowires 100 preferably comprises a core 110, preferably made of silicon, and a cladding 120 surrounding the core 110. The substrate 130 is preferably a metal. The core 110 preferably has high refractive index than the cladding 120. The term "cladding" as used herein means a layer of substance surrounding the core 110.

Figure 1B:
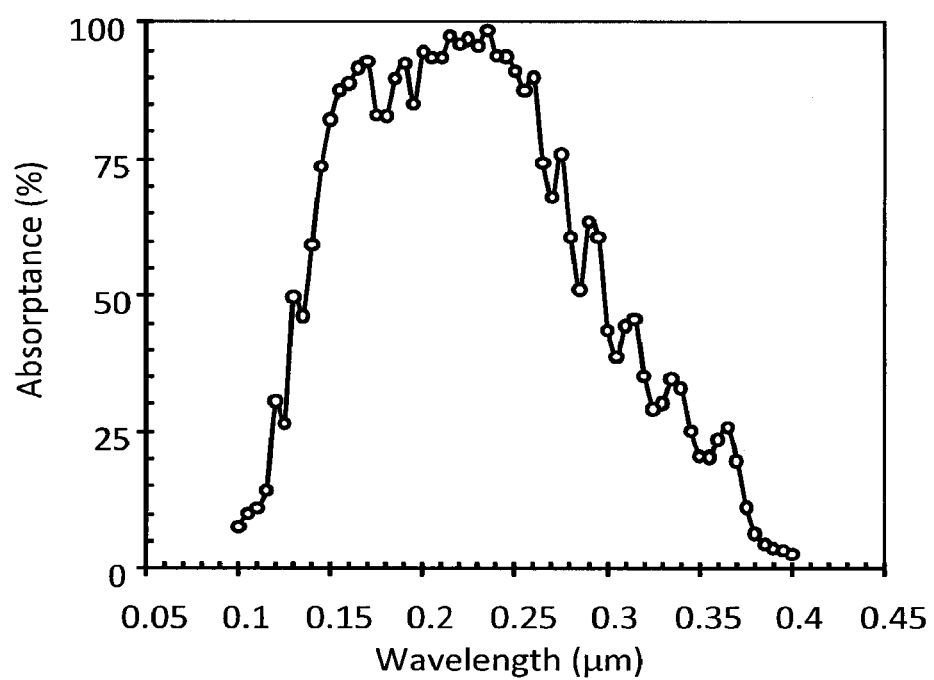
FIG. 1B shows simulated absorptance of the nanowire of FIG. 1A.
Figure 1C:
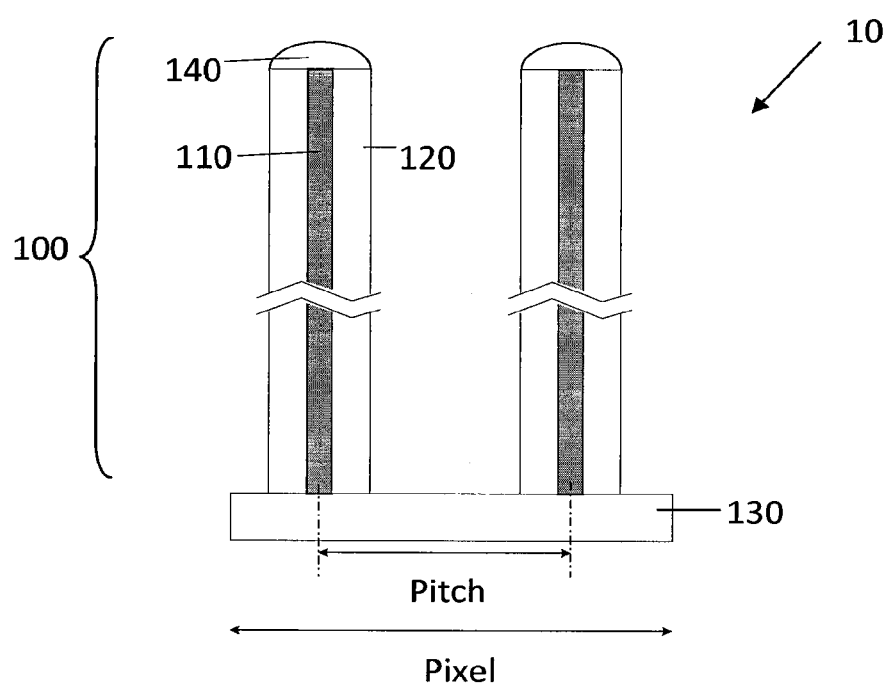
FIG. 1C shows optional couplers on the nanowires.

FIG. 1B shows simulated absorptance of the SBUV detector 10 of UV light with wavelengths between 100 and 400 nm, incident in the normal direction. FIG. 1B clearly shows that absorptance of the SBUV detector 10 of UV light with wavelengths between 140 and 290 nm is greater than 50% and absorptance of UV light drops quickly to almost zero outside wavelength region of 140-290 nm. FIG. 1B indicate that the SBUV detector 10 indeed only reacts to radiations in the SBUV region. As shown in FIG. 1C, each of the nanowires 100 can further comprise a coupler 140 disposed on an end of the nanowire 100 away from the substrate 130 (hereafter referred to as the "receiving end"). The term "coupler" as used herein means a layer effective to guide light into the nanowires.

According to an embodiment, the nanowires 100 have a diameter of from about 5 nm to about 30 nm, preferably about 20 nm. According to an embodiment, the nanowires 100 have a diameter of from about 5 nm to about 150 nm. The cladding 130 has a thickness of about 10 nm to about 200 nm, preferably about 30 nm. Pitch of the nanowires 100 (i.e. center-to-center distance of one of the plurality of nanowires to a nearest neighbor thereof) is from about 0.2 μm to about 2 μm. Height (i.e. dimension in the normal direction) of the nanowires 100 is from about 0.1 μm to about 5 μm. Each pixel can have one or more nanowires 100.

Figure 2A:
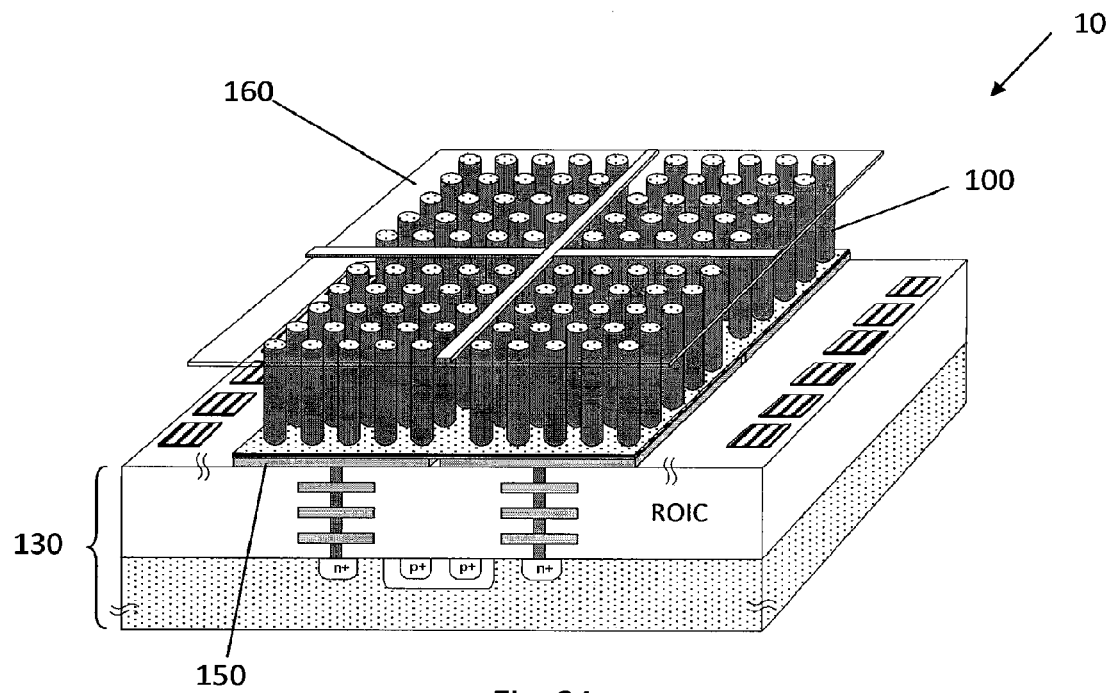
FIG. 2A and 2B show a perspective view and a top view of an image sensor according an embodiment.
Figure 2B:
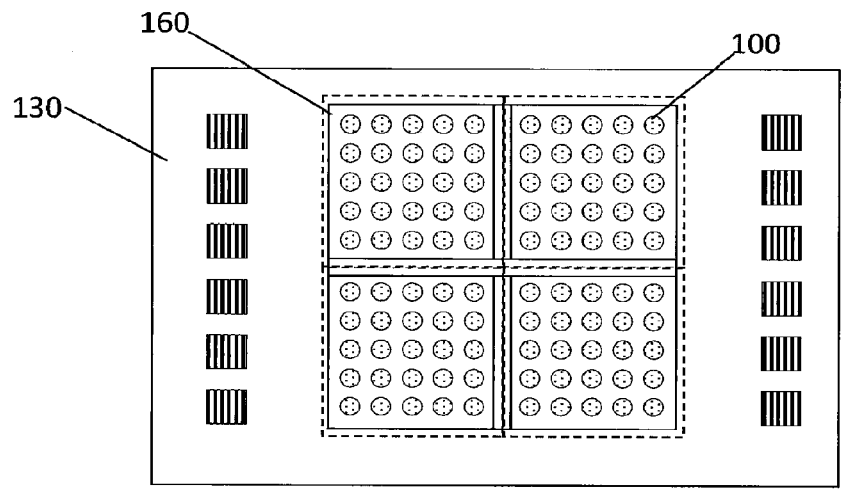

FIG. 2A and FIG. 2B shows a perspective view and a top view, respectively, of the SBUV detector 10. For brevity, only four pixels (regions enclosed by dotted rectangles) are shown. The nanowires 100 preferably detect UV radiation in the SBUV region by converting it to an electrical signal. For example, each nanowire 100 can comprise a photodiode (such as an avalanche photodiode) or form a photodiode (such as an avalanche photodiode) with the substrate 130. The SBUV detector 10 can further comprise electrical components configured to detect the electrical signal from the nanowires 100, for example, Readout Integrated Circuits (ROIC) in the substrate 130, an electrode 150 disposed between and electrically connected to all the nanowires 110 on each pixel, a common electrode 160 disposed on and electrically connected to the receiving ends of all the nanowires 110 in the entire SBUV detector 10. Preferably, the SBUV detector 10 can detect electrical signals from the nanowires 100 in different pixels separately.

Figure 3:
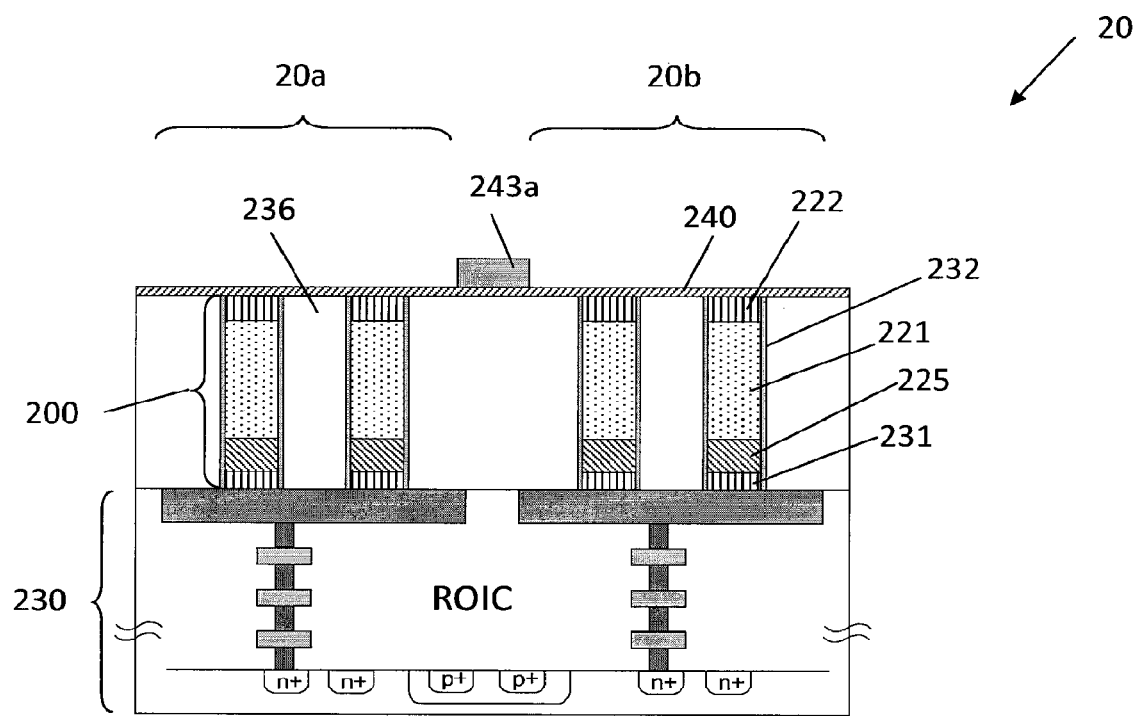
FIG. 3 shows an SBUV detector according to one embodiment.

FIG. 3 shows an SBUV detector 20 according to one embodiment. For brevity, two pixels 20a and 20b of a substrate 230 are illustrated. The SBUV detector 20, however, can comprise a plurality of pixels such as more than 100, more than 1000, more than 1000000. The pixels preferably have a pitch of about 0.5 μm micron to 100 μm (more preferably 2 μm). In each of the pixels 20a and 20b, the SBUV detector 20 comprises a plurality of nanowires 200, respectively. Each of the nanowires 200 comprises an APD, the APD being functional to convert at least a portion of UV radiation in the SBUV region impinged the nanowires 200 to an electrical signal. The nanowires 200 do not generate any electrical signal from any radiation outside the SBUV region. Each nanowire 200 comprises a first heavily doped semiconductor layer 222, a lightly doped semiconductor layer or an intrinsic semiconductor layer 221, a second heavily doped semiconductor layer 225, and a metal silicide layer 231. The first heavily doped semiconductor layer 222 is disposed on the lightly doped semiconductor layer or the intrinsic semiconductor layer 221. The lightly doped semiconductor layer or the intrinsic semiconductor layer 221 is disposed on the second heavily doped semiconductor layer 225. The second heavily doped semiconductor layer 225 is disposed on the metal silicide layer 231. The metal silicide layer 231 is disposed on the substrate 230. The first heavily doped semiconductor layer 222 is of an opposite type from the second heavily doped semiconductor layer 225. As used herein, one semiconductor having an opposite type from another semiconductor means the former is n type if the latter is p type or, the former is p type if the latter is n type. The first heavily doped semiconductor layer 222, the lightly doped semiconductor layer or the intrinsic semiconductor layer 221, and the second heavily doped semiconductor layer 225 form an APD. The metal silicide layer 231 forms electrical contact to any electrical components of the substrate 230. A common electrode 240 is disposed on the receiving ends of and electrically connected to all the nanowires 200. The common electrode 240 is substantially transparent to UV radiation in the SBUV region. For example, the common electrode 240 can be made of graphene. Space between the nanowires 200 is preferably filled with an oxide layer 236. The term "transparent" as used herein means a transmittance of at least 70%.

Figure 4:
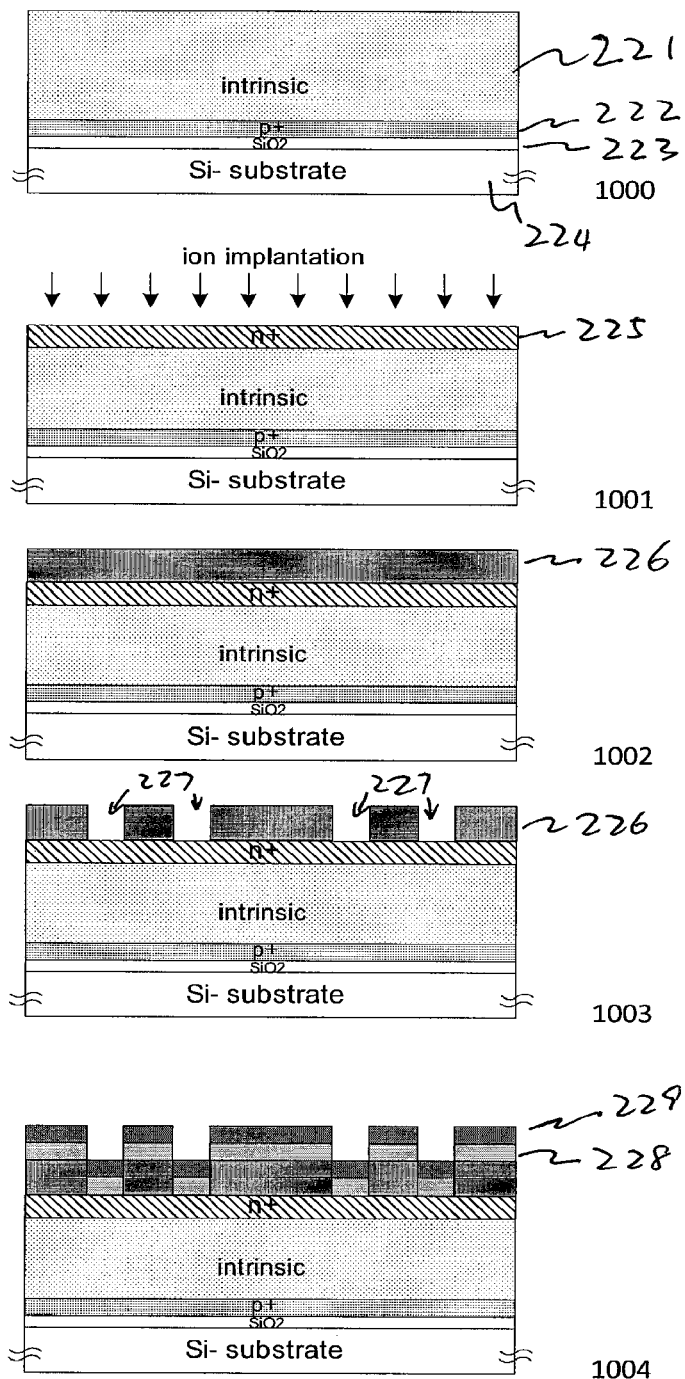
FIG. 4 shows an exemplary fabrication process of an image sensor such as the SBUV detector in FIG. 3.
Figure 4:
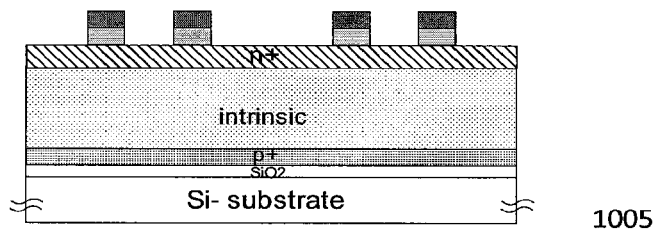
Figure 4:
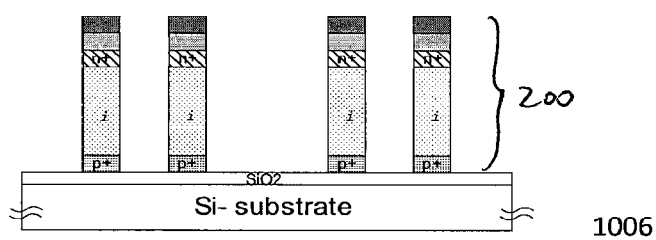
Figure 4:
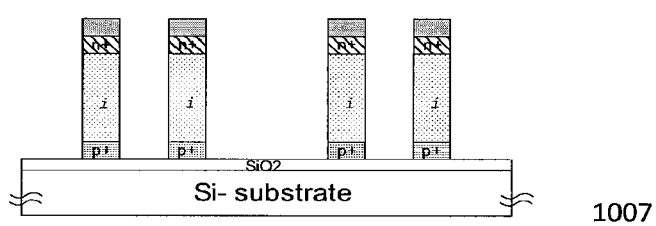
Figure 4:
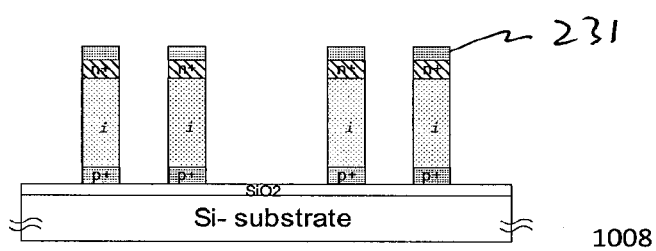
Figure 4:
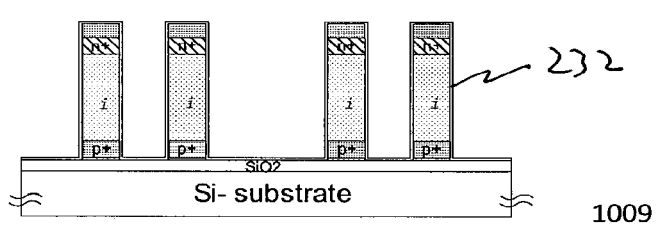
Figure 4:
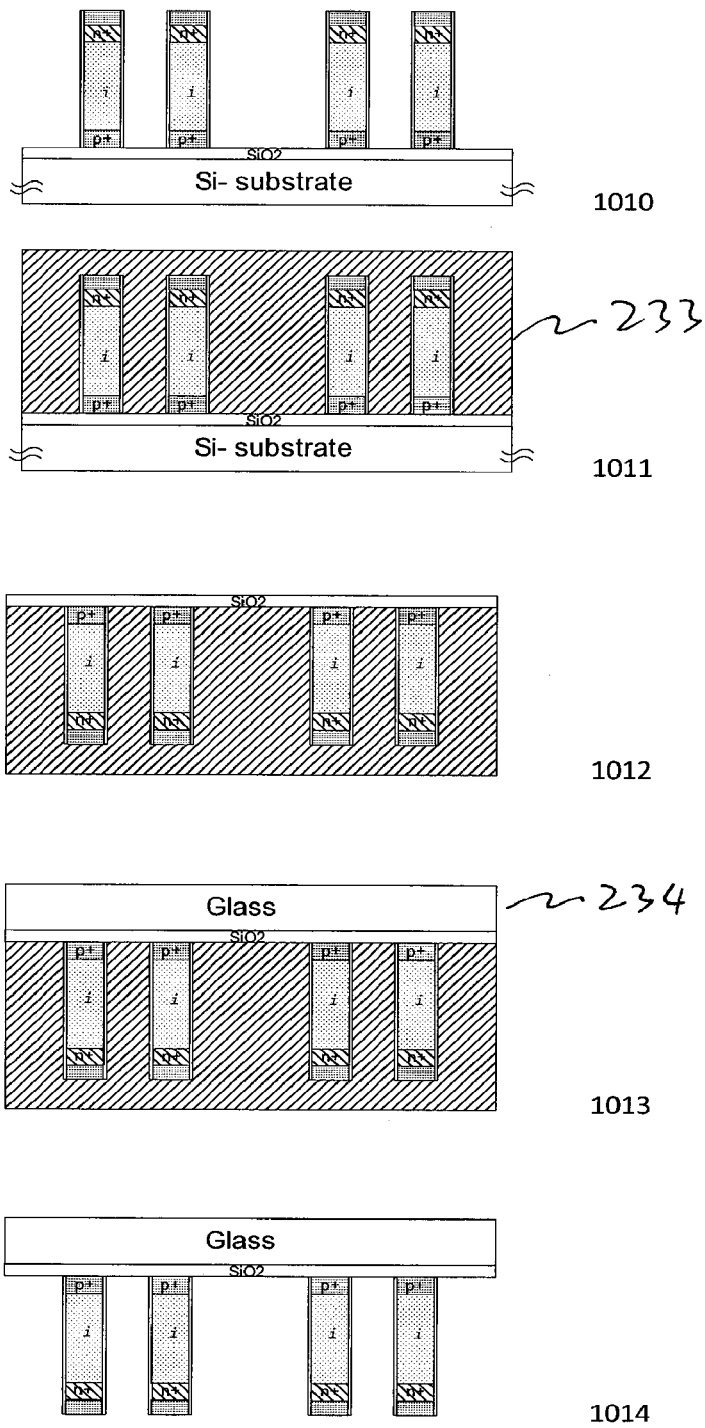
Figure 4:
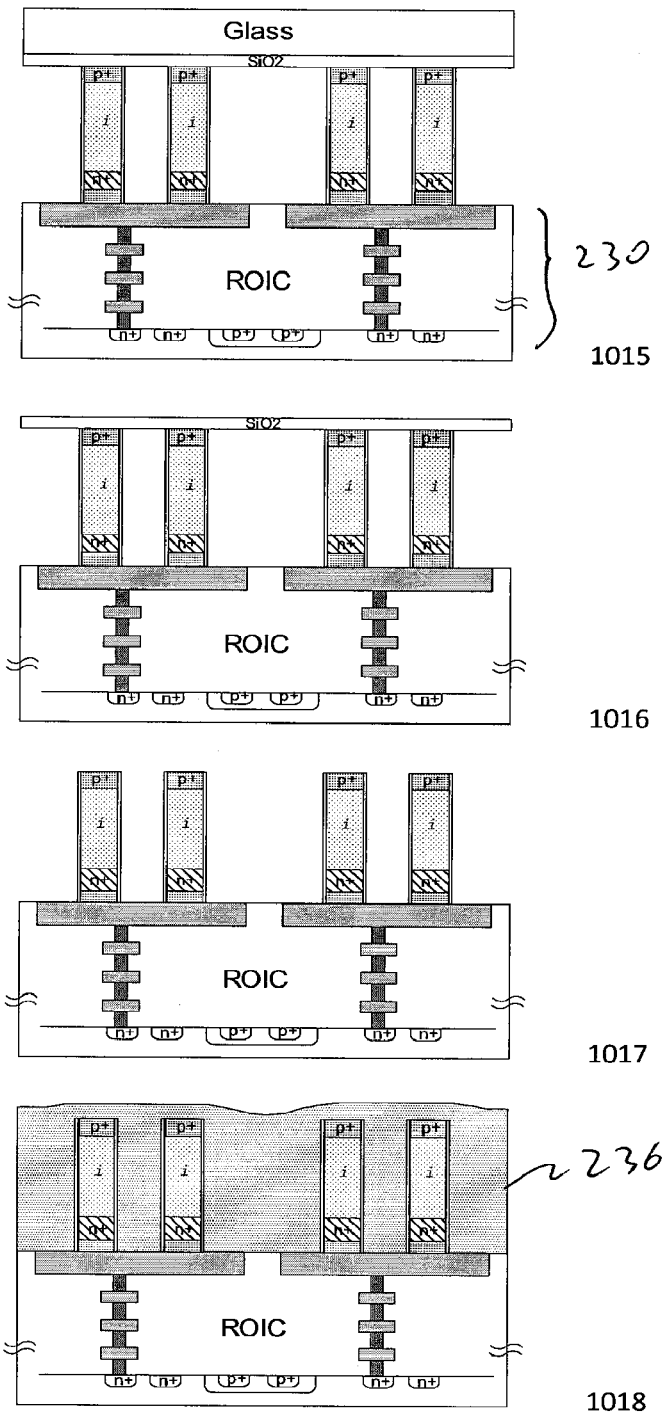
Figure 4:
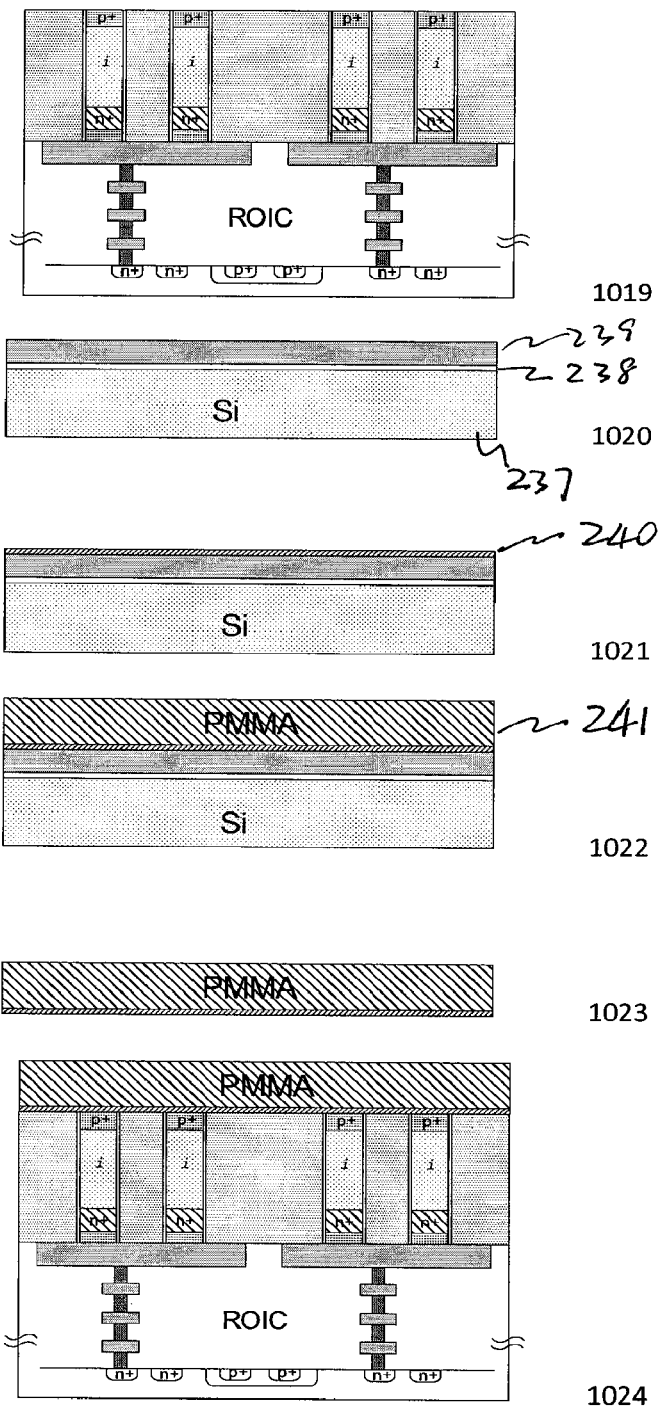
Figure 4:
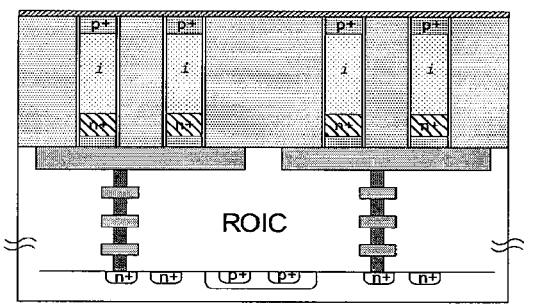
Figure 4:
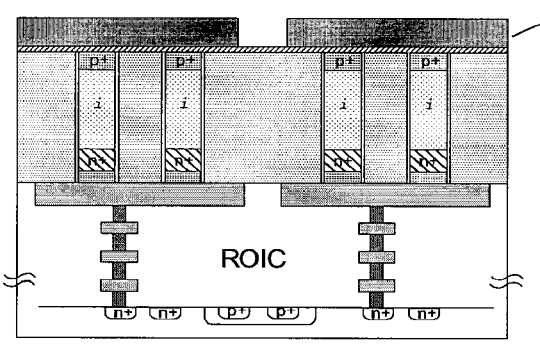
Figure 4:
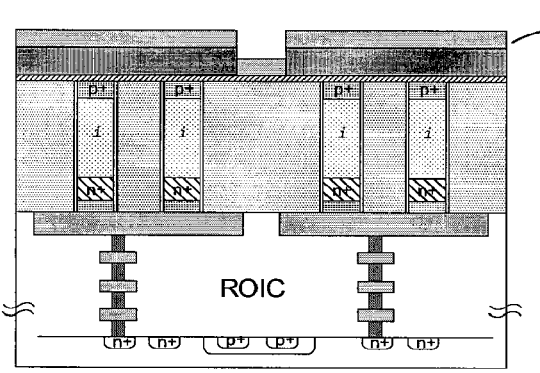
Figure 4:
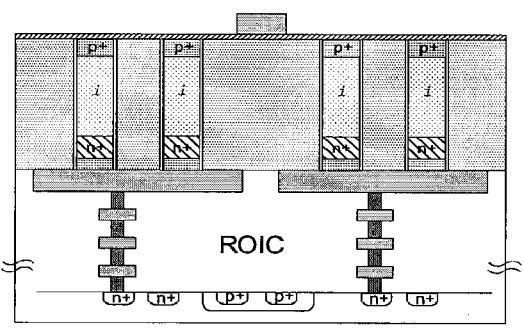

FIG. 4 shows an exemplary method of fabrication of the SBUV detector 10.

In step 1000, a silicon substrate 224 is provided, wherein the silicon substrate 224 comprises a silicon oxide layer 223 thereon and the first heavily doped semiconductor layer 222 (e.g. heavily doped p type silicon) on the silicon oxide layer 223. A substrate of semiconductor material other than silicon (e.g. III-V or II-VI group compound semiconductor) can also be used.

In step 1001, the second heavily doped semiconductor layer 225 (e.g. heavily doped n type silicon) is fabricated on the layer 221 by a method such as ion implantation and subsequent annealing. An exemplary n type dopant suitable for use in the ion implantation is phosphorous, arsenic, antimony, or a combination thereof.

In step 1002, a resist layer 226 (e.g. a photoresist or an e-beam resist) is deposited on the second heavily doped semiconductor layer 225, by a suitable method such as spin coating.

In step 1003, a pattern is formed in the resist layer 226 using a lithography technique (e.g. photolithrography or e-beam lithography) by removing portions 227 of the resist layer 226. The second heavily doped semiconductor layer 225 is exposed under the removed portions 227. The pattern corresponds to shapes and positions of the nanowires 200.

In step 1004, two metal layers 228 and 229 are deposited on the resist layer 226 and the exposed portions of the second heavily doped semiconductor layer 225, using a suitable technique such as thermal evaporation, e-beam evaporation, and sputtering. Exemplary metal suitable for use in the metal layers 228 and 229 are aluminum, gold, chromium, silver, copper, titanium, nickel or a combination thereof.

In step 1005, remainder of the resist layer 226 and portions of the metal layers 228 and 229 thereon are lift-off by a suitable technique such as plasma ashing and dissolution in a suitable solvent.

In step 1006, the nanowires 200 are formed by etching into the layers 225, 221 and 222, the using a suitable technique, such as dry etching with remainder of the metal layer 229 as etch mask, until portions of the silicon oxide layer 223 not directly below the remainder of the metal layer 229 are exposed. The nanowires 200 now comprise remainder of the layers 225, 221 and 222.

In step 1007, remainder of the metal layer 229 is removed by a suitable method such as etching with a suitable metal etchant. The metal layer 228 remains.

In step 1008, a silicide layer 231 is formed from the second heavily doped semiconductor layer 225 and the metal layer 228 thereon by annealing (e.g. at about 850° C. for about 30 minutes). Any remainder of the metal layer 228 is removed by a suitable technique such as etching with a suitable metal etchant.

In step 1009, an oxide layer 232 (e.g. $HfO_2$, $SiO_2$, $Al_2O_3$) is deposited isotropically over the nanowires 200 and the exposed portions of the silicon oxide layer 223, using suitable technique such as atomic layer deposition (ALD) and chemical vapor deposition (CVD). The oxide layer 232 is functional to passivate surfaces of nanowires 200. For example, the oxide layer 232 has a thickness of about 30 nm. The terms "passivation" and "passivate" as used herein means a process of eliminating dangling bonds (i.e., unsatisfied valence on immobilized atoms).

In step 1010, portions of the oxide layer 232 above the silicide layer 231 and the exposed portions of the silicon oxide layer 223 are removed by a suitable technique such as anisotropic dry etch. Now the silicide layer 231 is exposed.

In step 1011, a sacrificial layer 233 is deposited by pouring, spin coating or evaporation to fill space between the nanowires 200. The sacrificial layer 233 can be a suitable material such as polydimethylsiloxane, polyimide or oxide.

In step 1012, the substrate 224 is removed using a suitable technique such as etching with potassium hydroxide, until the silicon oxide layer 233 is exposed.

In step 1013, a glass substrate 234 is bonded to the exposed silicon oxide layer 233, using a suitable technique such as using a UV removable glue. The glass substrate 234 can provide mechanical support.

In step 1014, the sacrificial layer 233 is removed by a suitable method such as wet etching. For example, polyimide can be removed by a suitable photoresist developer.

In step 1015, the nanowires 200 are bonded to ROIC in the substrate 230 using a tin-silver alloy layer between the substrate 230 and the silicide layer 231 and annealing at about 220° C.

In step 1016, the glass substrate 234 is released from the silicon oxide layer 233 by illumination with UV light.

In step 1017, the silicon oxide layer 233 is removed by a suitable method such as etching with HF followed by rinsing.

In step 1018, the oxide layer 236 is deposited by spin coating, evaporation or CVD to fill space between the nanowires 200. The insulating material 236 preferably is transparent to UV radiation in the SBUV region. The insulating material 236 can be any suitable material such as silicon oxide, aluminum oxide, and graphene oxide.

In step 1019, the oxide layer 236 is planarized using a suitable technique such as chemical mechanical polishing (CMP) until the first heavily doped semiconductor 222 of the nanowires 200 is exposed.

In step 1020, an oxide layer 238 and a metal layer 239 are sequentially deposited on a sacrificial silicon substrate 237 using a suitable method such as thermal evaporation, e-beam evaporation, and sputtering. The metal layer 239 can be of any suitable material, such as nickel and iron.

In step 1021, a transparent conductive oxide (TCO) layer 240 is deposited on the metal layer 239 by a suitable method such as CVD using $C_2H_4$ or $C_2H_2$ gas. The TCO layer 240 can be any suitable material such as graphene. The TCO layer 240 is substantially transparent to UV radiation in the SBUV region.

In step 1022, a plastic layer 241 is deposited on the TCO layer 240 by a suitable method such as spin coating. The plastic layer 241 can be any suitable material such as poly (methyl methacrylate) (PMMA).

In step 1023, the sacrificial silicon substrate 237, the oxide layer 238 and the metal layer 239 are removed by a suitable method such as wet etching with KOH, HF, metal etchant, respectively.

In step 1024, the TCO layer 240 and the plastic layer 241 are transfer onto the receiving ends of the nanowires 200 under a wet condition, followed by annealing at about 220° C. for about 20 minutes to form electrical contact between the TCO layer 240 and the receiving ends of the nanowires 200.

In step 1025, the plastic layer 241 is removed by a suitable method such dry etch or wet etch.

In step 1026, a resist layer 242 (e.g. a photoresist or an e-beam resist) is deposited on the TCO layer 240 (which functions as the common electrode 240), by a suitable method such as spin coating. A pattern is formed in the resist layer 242 using a lithography technique (e.g. photolithrography or e-beam lithography) by removing portions of the resist layer 425 above boundaries of pixels of the substrate 230.

In step 1027, a metal layer 243 is deposited, using a suitable method such as thermal evaporation, e-beam evaporation, and sputtering. Exemplary metal suitable for use in the metal layer 243 are aluminum, gold, chromium, silver, copper, titanium, nickel or a combination thereof.

In step 1028, remainder of the resist layer 242 and portions of the metal layer 243 thereon are lift-off by a suitable technique such as plasma ashing and dissolution in a suitable solvent.

Figure 5:
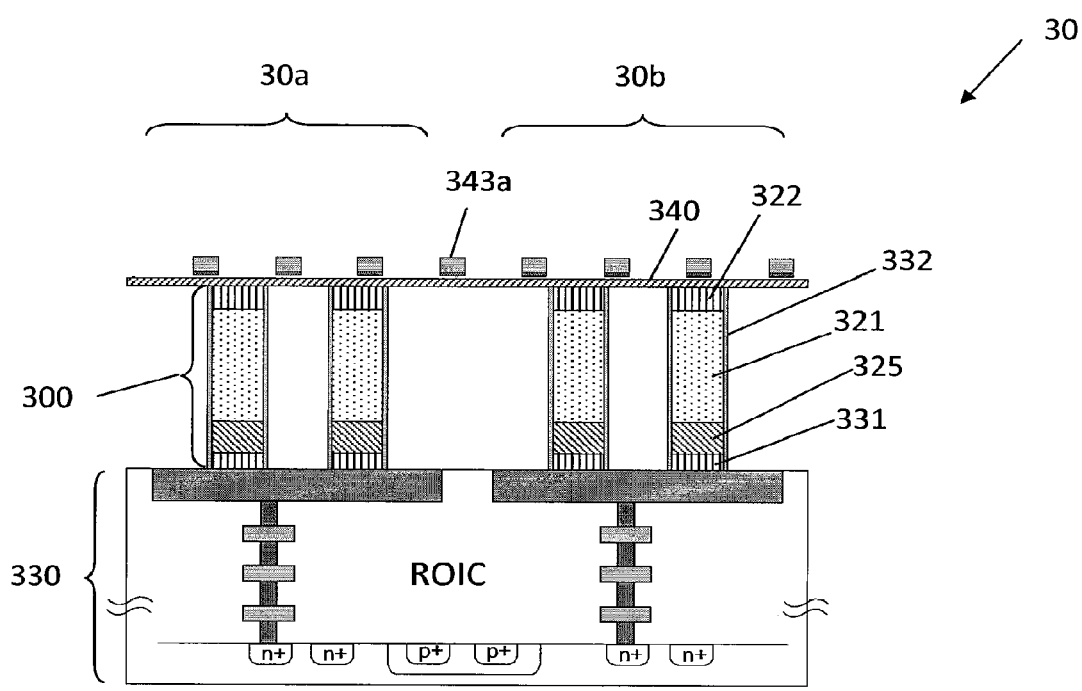
FIG. 5 shows an SBUV detector according to one embodiment.

FIG. 5 shows an SBUV detector 30 according to one embodiment. For brevity, two pixels 30*a* and 30*b* of a substrate 330 are illustrated. The SBUV detector 30, however, can comprise a plurality of pixels such as more than 100, more than 1000, more than 1000000. The pixels preferably have a pitch of about 0.5 µm micron to 100 µm (more preferably 2 µm). In each of the pixels 30*a* and 30*b*, the SBUV detector 30 comprises a plurality of nanowires 300, respectively. Each of the nanowires 300 comprises an APD, the APD being functional to convert at least a portion of UV radiation in the SBUV region impinged on the nanowires 300 to an electrical signal. The nanowires 300 do not generate any electrical signal from any radiation outside the SBUV region. Each nanowire 300 comprises a first heavily doped semiconductor layer 322, a lightly doped semiconductor layer or an intrinsic semiconductor layer 321, a second heavily doped semiconductor layer 325, and a metal silicide layer 331. The first heavily doped semiconductor layer 322 is disposed on the lightly doped semiconductor layer or the intrinsic semiconductor layer 321. The lightly doped semiconductor layer or the intrinsic semiconductor layer 321 is disposed on the second heavily doped semiconductor layer 325. The second heavily doped semiconductor layer 325 is disposed on the metal silicide layer 331. The metal silicide layer 331 is disposed on the substrate 330. The first heavily doped semiconductor layer 322 is of an opposite type from the second heavily doped semiconductor layer 325. The first heavily doped semiconductor layer 322, the lightly doped semiconductor layer or the intrinsic semiconductor layer 321, and the second heavily doped semiconductor layer 325 form an APD. The metal silicide layer 331 forms electrical contact to any electrical components of the substrate 330. A common electrode 340 is disposed on the receiving ends of and electrically connected to all the nanowires 300. The common electrode 340 is substantially transparent to UV radiation in the SBUV region. For example, the common electrode 340 can be made of graphene. Space between the nanowires 300 is preferably not filled. A metal grid on the common electrode 340 can provide mechanical support for the common electrode.

Figure 6:
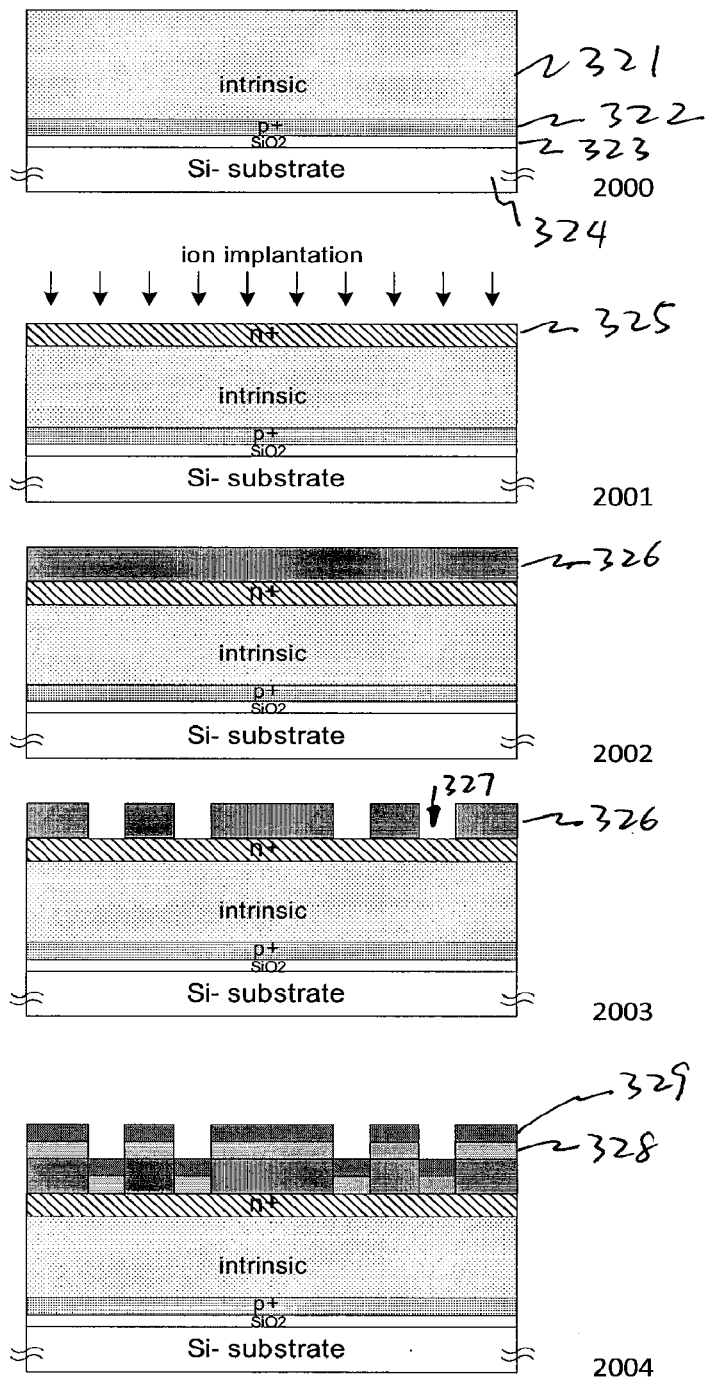
FIG. 6 shows an exemplary fabrication process of an image sensor such as the SBUV detector in FIG. 5.
Figure 6:
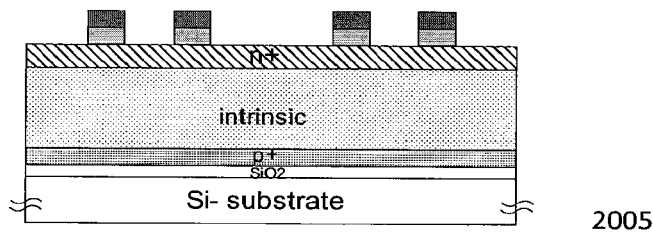
Figure 6:
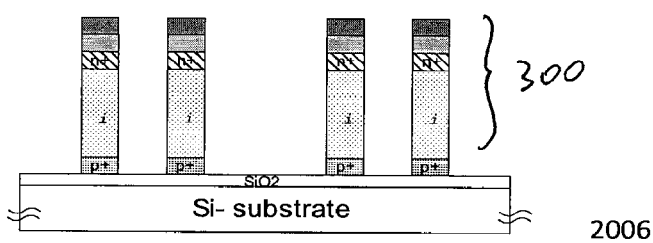
Figure 6:
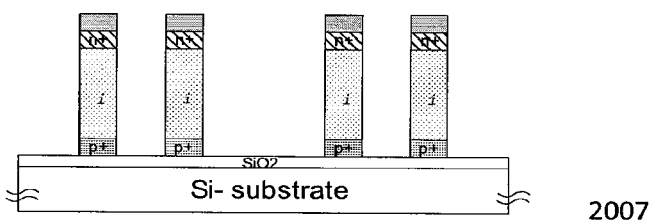
Figure 6:
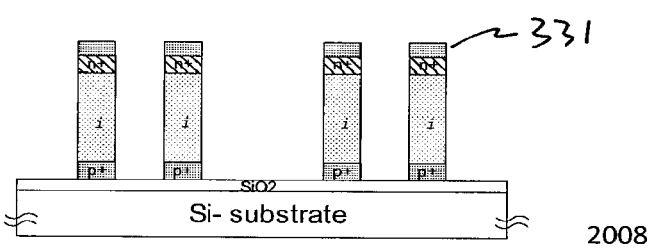
Figure 6:
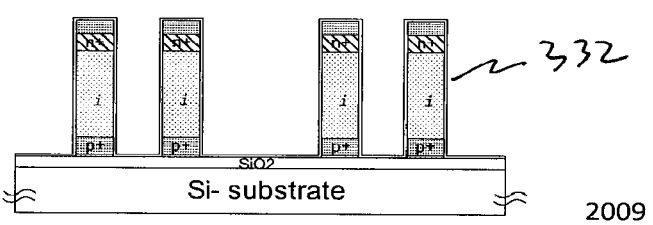
Figure 6:
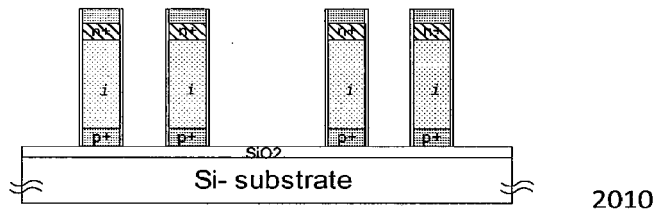
Figure 6:
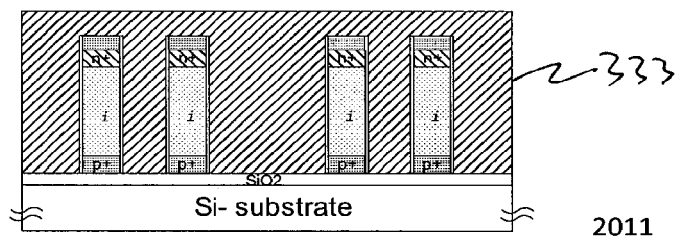
Figure 6:
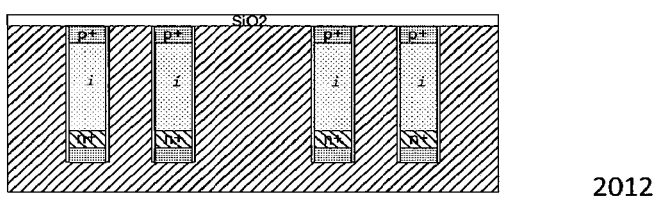
Figure 6:
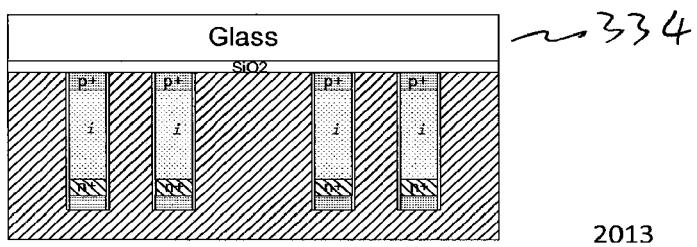
Figure 6:
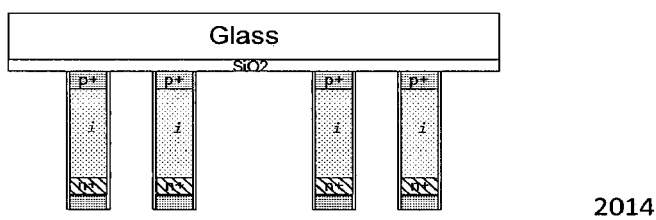
Figure 6:
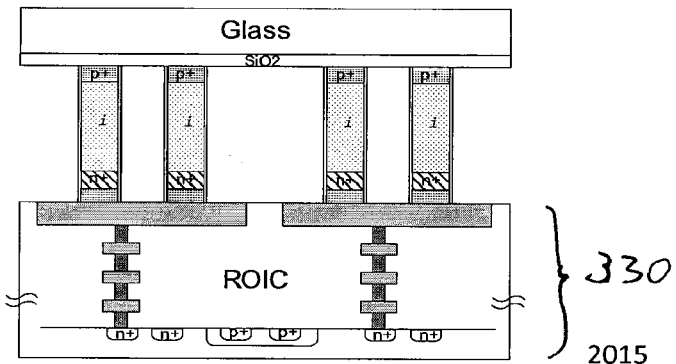
Figure 6:
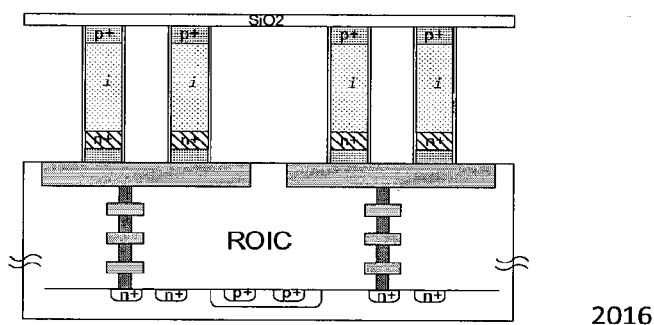
Figure 6:
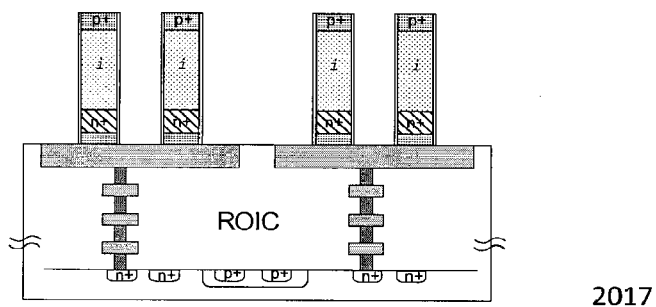
Figure 6:
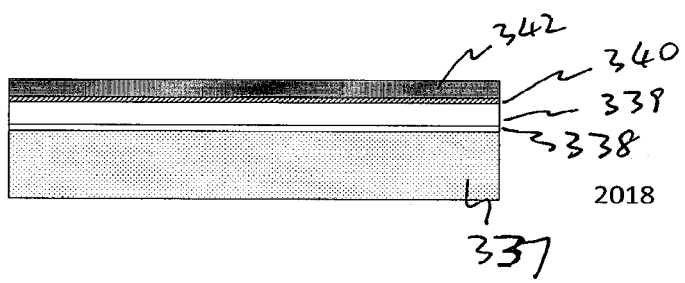
Figure 6:
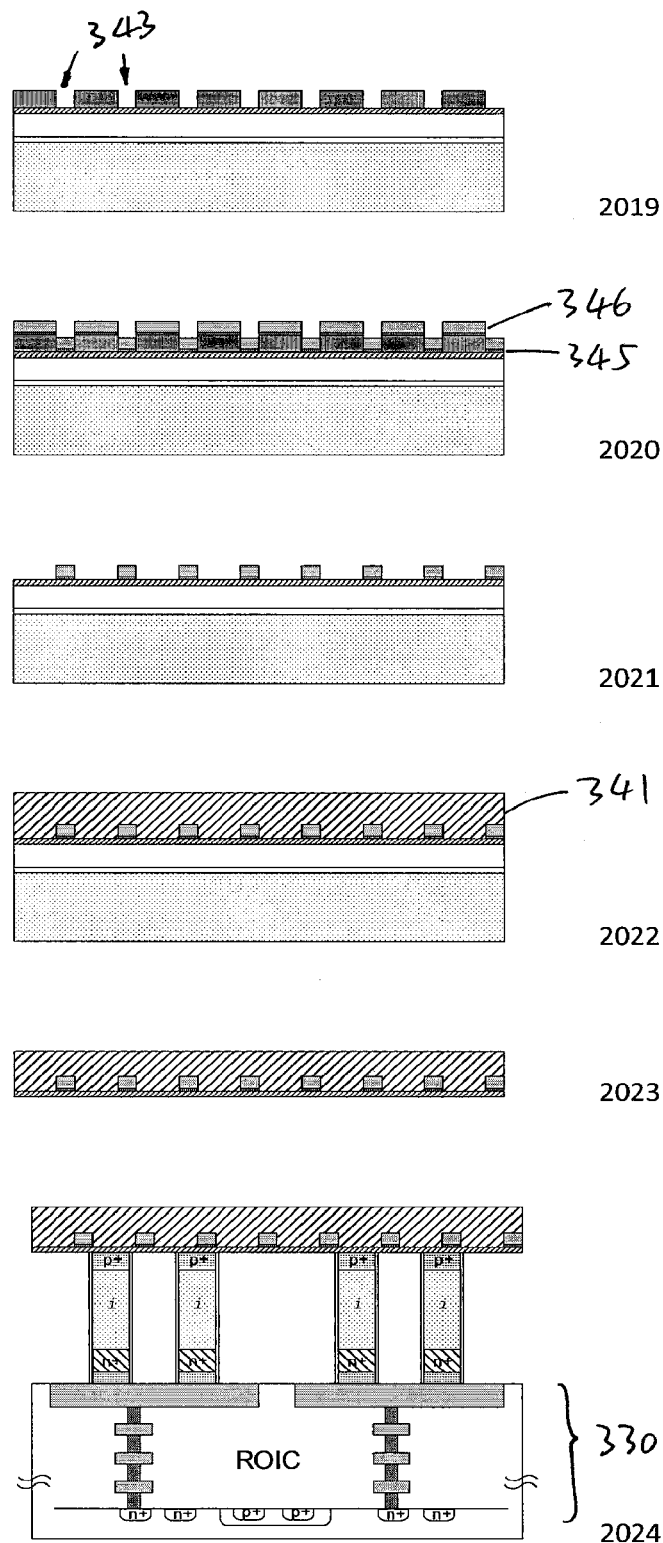
Figure 6:
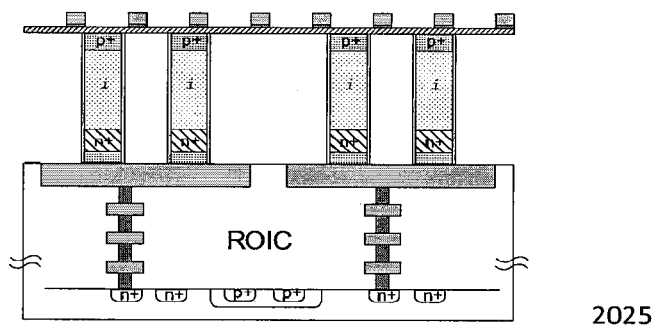

FIG. 6 shows an exemplary method of fabrication of the SBUV detector 30.

In step 2000, a silicon substrate 324 is provided, wherein the silicon substrate 324 comprises an silicon oxide layer 323 thereon and the first heavily doped semiconductor layer 322 (e.g. heavily doped p type silicon) on the silicon oxide layer 323. A substrate of semiconductor material other than silicon (e.g. III-V or II-VI group compound semiconductor) can also be used.

In step 2001, the second heavily doped semiconductor layer 325 (e.g. heavily doped n type silicon) is fabricated on the layer 321 by a method such as ion implantation and subsequent annealing. An exemplary n type dopant suitable for use in the ion implantation is phosphorous, arsenic, antimony, or a combination thereof.

In step 2002, a resist layer 326 (e.g. a photoresist or an e-beam resist) is deposited on the second heavily doped semiconductor layer 325, by a suitable method such as spin coating.

In step 2003, a pattern is formed in the resist layer 326 using a lithography technique (e.g. photolithrography or e-beam lithography) by removing portions 327 of the resist layer 326. The second heavily doped semiconductor layer 325 is exposed under the removed portions 327. The pattern corresponds to shapes and positions of the nanowires 300.

In step 2004, two metal layers 328 and 329 are deposited on the resist layer 326 and the exposed portions of the second heavily doped semiconductor layer 325, using a suitable technique such as thermal evaporation, e-beam evaporation, and sputtering. Exemplary metal suitable for use in the metal layers 328 and 329 are aluminum, gold, chromium, silver, copper, titanium, nickel or a combination thereof.

In step 2005, remainder of the resist layer 326 and portions of the metal layers 328 and 329 thereon are lift-off by a suitable technique such as plasma ashing and dissolution in a suitable solvent.

In step 2006, the nanowires 300 are formed by etching into the layers 325, 321 and 322, the using a suitable technique, such as dry etching with remainder of the metal layer 329 as etch mask, until portions of the silicon oxide layer 323 not directly below the remainder of the metal layer 329 are exposed. The nanowires 300 now comprise remainder of the layers 325, 321 and 322.

In step 2007, remainder of the metal layer 329 is removed by a suitable method such as etching with a suitable metal etchant. The metal layer 328 remains.

In step 2008, a silicide layer 331 is formed from the second heavily doped semiconductor layer 325 and the metal layer 328 thereon by annealing (e.g. at about 850° C. for about 30 minutes). Any remainder of the metal layer 328 is removed by a suitable technique such as etching with a suitable metal etchant.

In step 2009, an oxide layer 332 (e.g. $HfO_2$, $SiO_2$, $Al_2O_3$) is deposited isotropically over the nanowires 300 and the exposed portions of the silicon oxide layer 323, using suitable technique such as atomic layer deposition (ALD) and chemical vapor deposition (CVD). The oxide layer 332 is functional to passivate surfaces of nanowires 200. For example, the oxide layer 332 has a thickness of about 30 nm.

In step 2010, portions of the oxide layer 332 above the silicide layer 331 and the exposed portions of the silicon oxide layer 323 are removed by a suitable technique such as anisotropic dry etch. Now the silicide layer 331 is exposed.

In step 2011, a sacrificial layer 333 is deposited by pouring, spin coating or evaporation to fill space between the nanowires 300. The sacrificial layer 333 can be a suitable material such as polydimethylsiloxane, polyimide or oxide.

In step 2012, the substrate is removed using a suitable technique such as etching with potassium hydroxide, until the silicon oxide layer 333 is exposed.

In step 2013, a glass substrate 334 is bonded to the exposed silicon oxide layer 333, using a suitable technique such as using a UV removable glue. The glass substrate 334 can provide mechanical support.

In step 2014, the sacrificial layer 333 is removed by a suitable method such as wet etching. For example, polyimide can be removed by a suitable photoresist developer.

In step 2015, the nanowires 300 are bonded to ROIC in the substrate 330 using a tin-silver alloy layer between the substrate 330 and the silicide layer 331 and annealing at about 220° C.

In step 2016, the glass substrate 334 is released from the silicon oxide layer 333 by illumination with UV light.

In step 2017, the silicon oxide layer 333 is removed by a suitable method such as etching with HF followed by rinsing.

In step 2018, an oxide layer 338 and a metal layer 339 are sequentially deposited on a sacrificial silicon substrate 337 using a suitable method such as thermal evaporation, e-beam evaporation, and sputtering. The metal layer 339 can be of any suitable material, such as nickel and iron. The metal layer 339 preferably has a thickness at least 100 nm. A transparent conductive oxide (TCO) layer 340 (which functions as the common electrode 340) is then deposited on the metal layer 339 by a suitable method such as CVD using $C_2H_4$ or $C_2H_2$ gas. The TCO layer 340 can be any suitable material such as graphene. The TCO layer 340 is substantially transparent to UV radiation in the SBUV region. A resist layer 342 (e.g. a photoresist or an e-beam resist) is deposited on the TCO layer 340, by a suitable method such as spin coating.

In step 2019, a pattern is formed in the resist layer 342 using a lithography technique (e.g. photolithrography or e-beam lithography) by removing portions 343 of the resist layer 342. The TCO layer 340 is exposed under the removed portions 342. The removed portions 343 preferable have a width about 30 nm. The pattern can be a grid pattern in which the removed portions 343 separate the resist layer 342 into discrete square regions, which preferably have a width of about 120 nm.

In step 2020, two metal layers 345 and 346 are deposited on the resist layer 342 and the exposed portions of the TCO layer 340, using a suitable technique such as thermal evaporation, e-beam evaporation, and sputtering. Exemplary metal suitable for use in the metal layers 345 and 346 are aluminum, gold, chromium, silver, copper, titanium, nickel or a combination thereof.

In step 2021, remainder of the resist layer 342 and portions of the metal layers 345 and 346 thereon are lift-off by a suitable technique such as plasma ashing and dissolution in a suitable solvent.

In step 2022, a plastic layer 341 is deposited on the TCO layer 340 by a suitable method such as spin coating. The plastic layer 341 can be any suitable material such as poly (methyl methacrylate) (PMMA) and polydimethylsiloxane.

In step 2023, the sacrificial silicon substrate 337, the oxide layer 338 and the metal layer 339 are removed by a suitable method such as wet etching with KOH, HF, metal etchant, respectively.

In step 2024, the TCO layer 340, and the metal layers 345 and 346 are transfer onto the receiving ends of the nanowires 300 under a wet condition, followed by annealing at about 220° C. for about 20 minutes to form electrical contact between the TCO layer 340 and the receiving ends of the nanowires 300.

In step 2025, the plastic layer 341 is removed by a suitable method such dry etch or wet etch.

Figure 7:
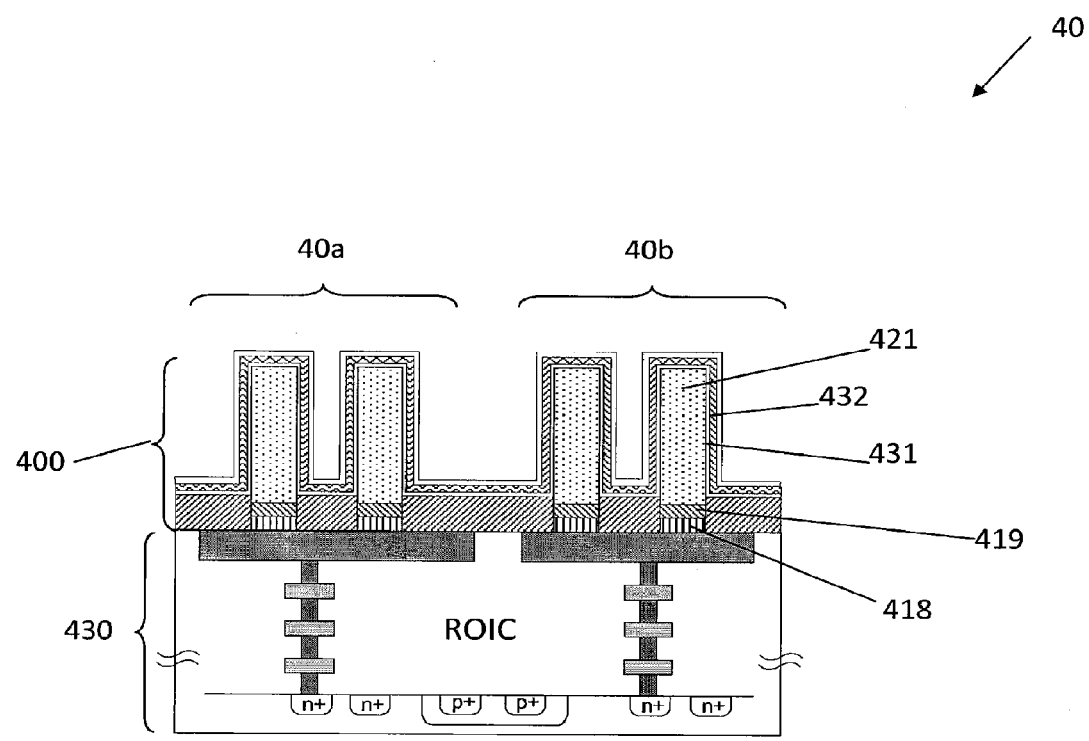
FIG. 7 shows an SBUV detector according to one embodiment.

FIG. 7 shows a device 40 according to one embodiment. For brevity, two pixels 40a and 40b of a substrate 430 are illustrated. The SBUV detector 40, however, can comprise a plurality of pixels such as more than 100, more than 1000, more than 1000000. The pixels preferably have a pitch of about 0.5 μm micron to 100 μm (more preferably 2 μm). In each of the pixels 40a and 40b, the SBUV detector 40 comprises a plurality of nanowires 400, respectively. Each of the nanowires 400 comprises an APD, the APD being functional to convert at least a portion of UV radiation in the SBUV region impinged on the nanowires 400 to an electrical signal. The nanowires 400 do not generate any electrical signal from any radiation outside the SBUV region. Each nanowire 400 comprises a core 421 of lightly doped semiconductor, an intermediate shell 431 of intrinsic semiconductor and an outer shell 432 of doped semiconductor. The intermediate shell 431 is conformally disposed over the core 421. The outer shell 432 is conformally disposed over the intermediate shell 431. The outer shell 432 is of an opposite type from the core 421. The outer shell 432, the intermediate shell 431 and the core 421 form the APD. Each nanowire 400 can further comprise a heavily doped semiconductor layer 419 of the same type as the core 421, and a metal silicide layer 418 wherein the heavily doped semiconductor layer 419 and a metal silicide layer 418 are sandwiched between the core 421 and the substrate 430. As used herein, one semiconductor having a same type as another semiconductor means the former is n type if the latter is n type or, the former is p type if the latter is p type. The intermediate shell 431 and the outer shell 432 do not contact the heavily doped semiconductor layer 419 and the metal silicide layer 418. The metal silicide layer 418 is in contact with the substrate 430 and forms electrical contact to any electrical components of the substrate 430.

Figure 8:
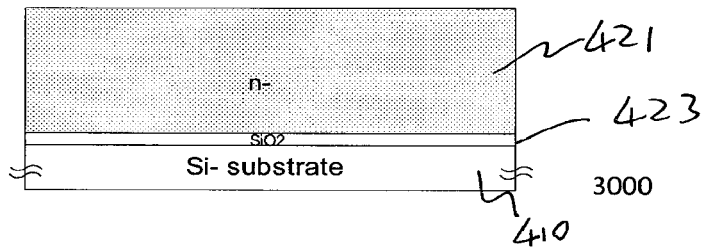
FIG. 8 shows an exemplary fabrication process of an image sensor such as the SBUV detector in FIG. 7.
Figure 8:
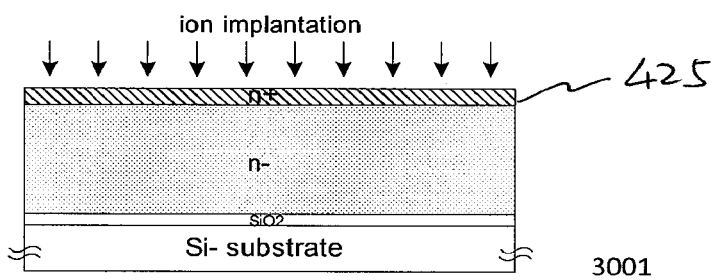
Figure 8:
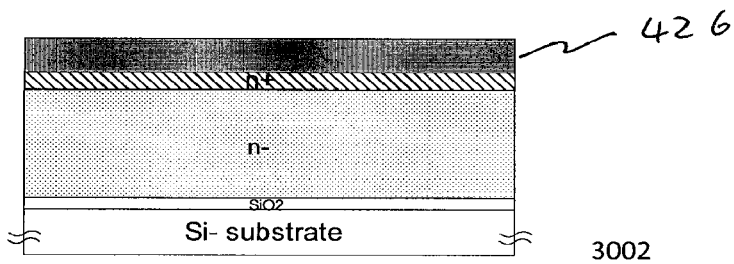
Figure 8:
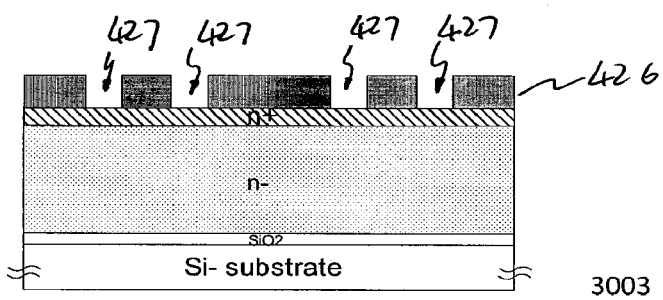
Figure 8:
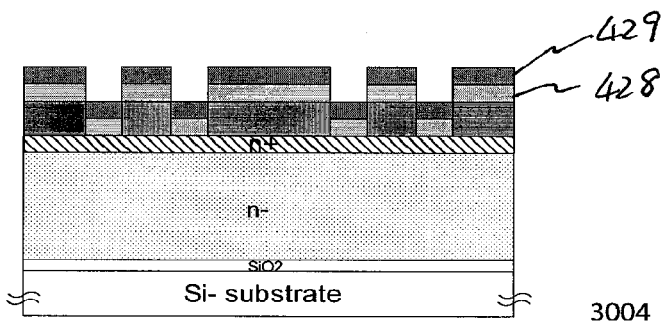
Figure 8:
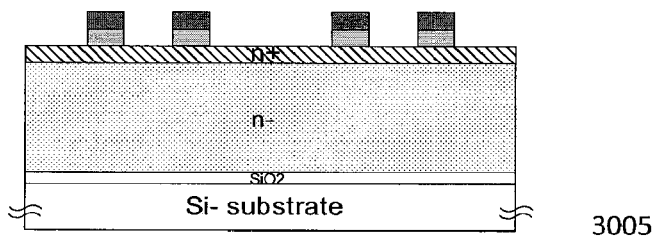
Figure 8:
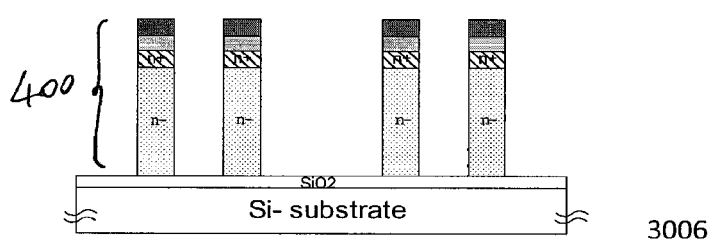
Figure 8:
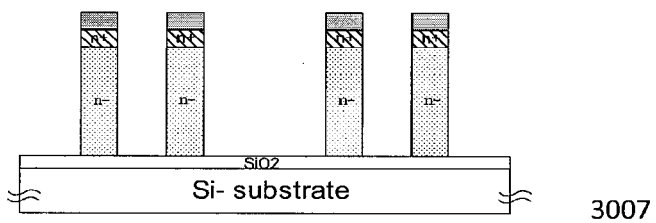
Figure 8:
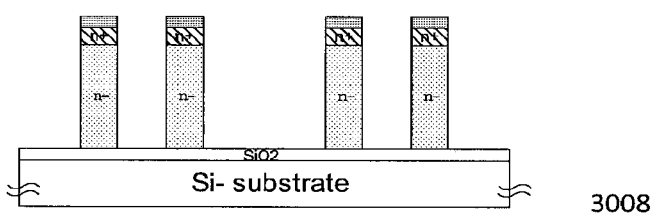
Figure 8:
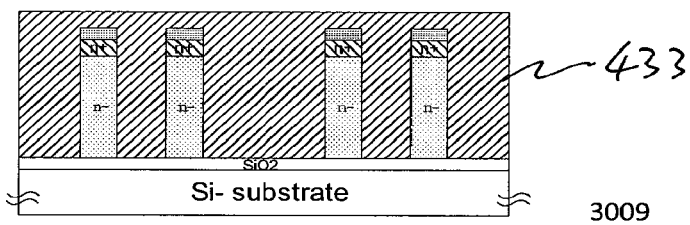
Figure 8:
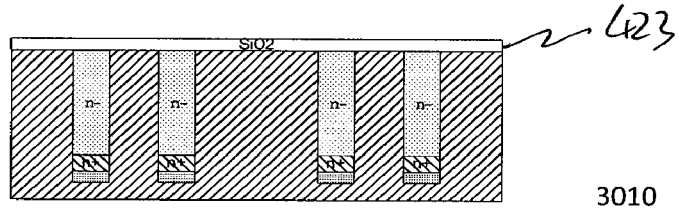
Figure 8:
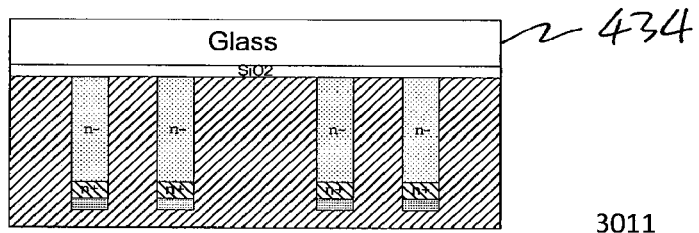
Figure 8:
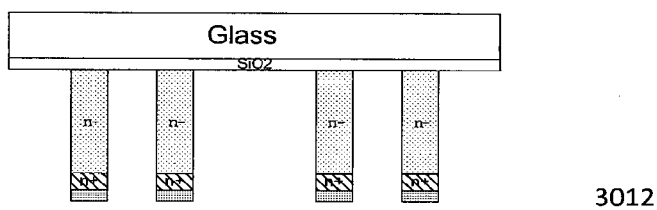
Figure 8:
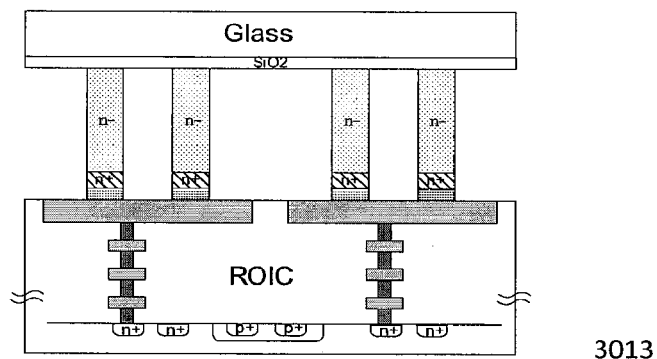
Figure 8:
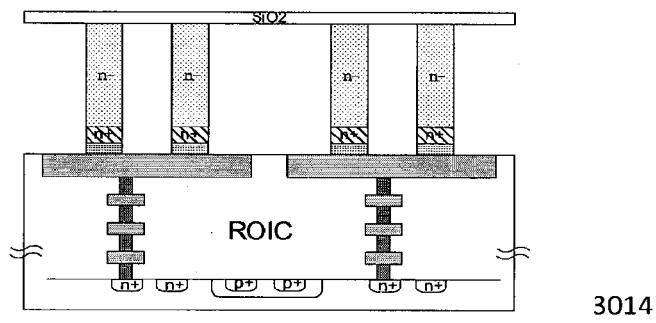
Figure 8:
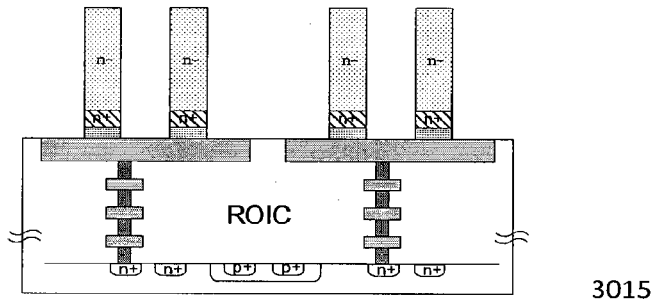
Figure 8:
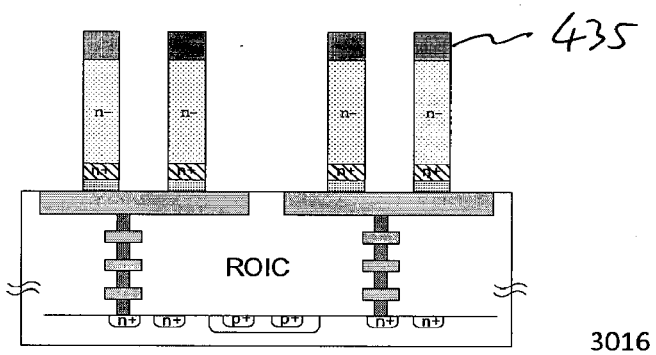
Figure 8:
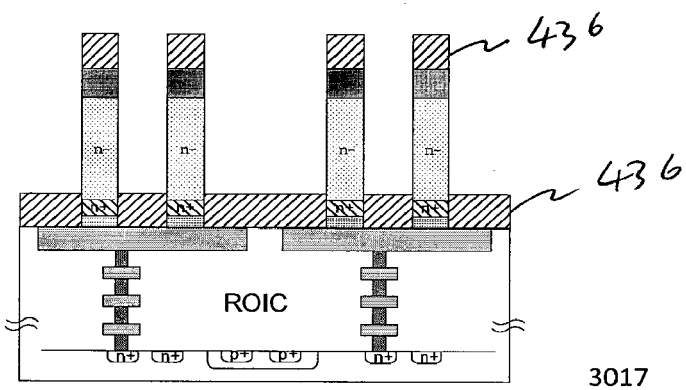
Figure 8:
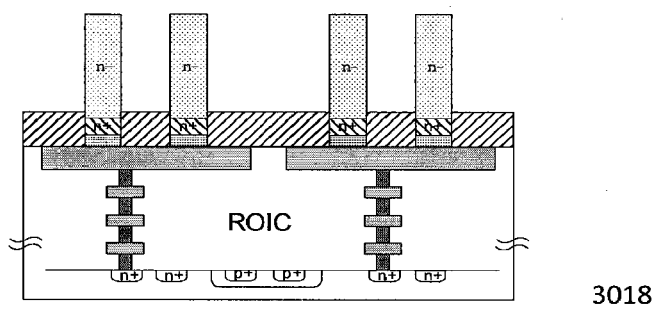
Figure 8:
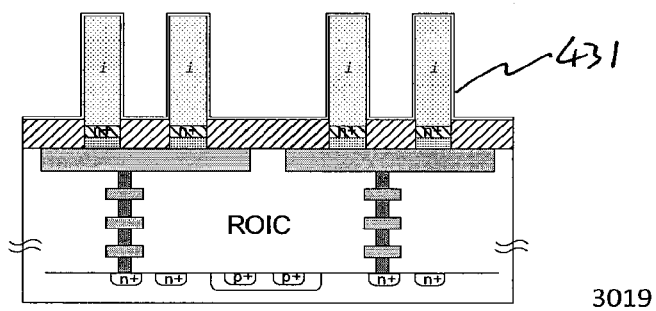
Figure 8:
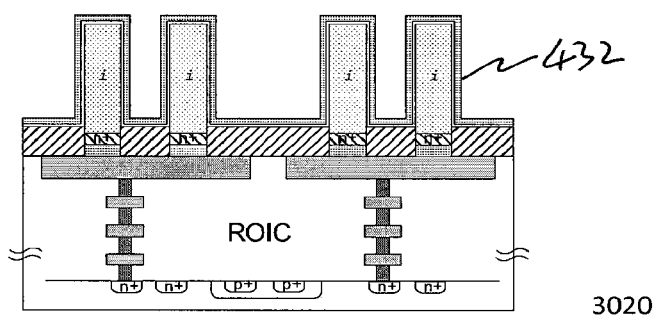
Figure 8:
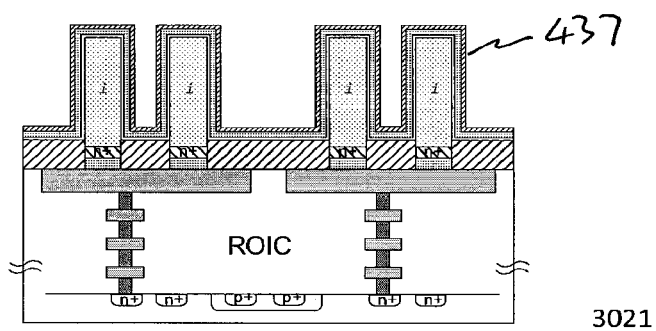

FIG. 8 shows an exemplary method of fabrication of the SBUV detector 40.

In step 3000, a silicon substrate 410 is provided, wherein the silicon substrate 410 comprises a lightly doped semiconductor layer 421 (e.g. epitaxial n type silicon), and a silicon oxide layer 423 sandwiched between the silicon substrate 410 and the lightly doped semiconductor layer 421. A substrate of semiconductor material other than silicon (e.g. III-V or II-VI group compound semiconductor) can also be used.

In step 3001, the heavily doped semiconductor layer 419 (e.g. heavily doped n type silicon) is fabricated on the lightly doped semiconductor layer 421 by a method such as ion implantation and subsequent annealing. An exemplary n type dopant suitable for use in the ion implantation is phosphorous, arsenic, antimony, or a combination thereof.

In step 3002, a resist layer 426 (e.g. a photoresist or an e-beam resist) is deposited on the heavily doped semiconductor layer 425, by a suitable method such as spin coating.

In step 3003, a pattern is formed in the resist layer 426 using a lithography technique (e.g. photolithrography or e-beam lithography) by removing portions 427 of the resist layer 426. The heavily doped semiconductor layer 425 is exposed under the removed portions 427. The pattern corresponds to shapes and positions of the nanowires 400.

In step 3004, two metal layers 428 and 429 are deposited on the resist layer 426 and the exposed portions of the heavily doped semiconductor layer 425, using a suitable technique such as thermal evaporation, e-beam evaporation, and sputtering. Exemplary metal suitable for use in the metal layers 428 and 429 are aluminum, gold, chromium, silver, copper, titanium, nickel or a combination thereof.

In step 3005, remainder of the resist layer 426 and portions of the metal layers 428 and 429 thereon are lift-off by a suitable technique such as plasma ashing and dissolution in a suitable solvent.

In step 3006, the nanowires 400 are formed by etching into the layers 425 and 421, the using a suitable technique, such as dry etching with remainder of the metal layer 429 as etch mask, until portions of the silicon oxide layer 423 not directly below the remainder of the metal layer 429 are exposed. The nanowires 400 now comprise remainder of the layers 425 and 421.

In step 3007, remainder of the metal layer 429 is removed by a suitable method such as etching with a suitable metal etchant. The metal layer 428 remains.

In step 3008, a silicide layer 418 is formed from the heavily doped semiconductor layer 425 and the metal layer 428 thereon by annealing (e.g. at about 850° C. for about 30 minutes). Any remainder of the metal layer 428 is removed by a suitable technique such as etching with a suitable metal etchant.

In step 3009, a sacrificial layer 433 is deposited by pouring, spin coating or evaporation to fill space between the nanowires 400. The sacrificial layer 433 can be a suitable material such as polydimethylsiloxane, polyimide or oxide.

In step 3010, the substrate 410 is removed using a suitable technique such as etching with potassium hydroxide, until the silicon oxide layer 423 is exposed.

In step 3011, a glass substrate 434 is bonded to the exposed silicon oxide layer 423, using a suitable technique such as using a UV removable glue. The glass substrate 434 can provide mechanical support.

In step 3012, the sacrificial layer 433 is removed by a suitable method such as wet etching. For example, polyimide can be removed by a suitable photoresist developer.

In step 3013, the nanowires 400 are bonded to ROIC in the substrate 330 using a tin-silver alloy layer between the substrate 330 and the silicide layer 418 and annealing at about 220° C.

In step 3014, the glass substrate 434 is released from the silicon oxide layer 423 by illumination with UV light.

In step 3015, the silicon oxide layer 423 is removed by a suitable method such as etching with HF followed by rinsing.

In step 3016, a resist layer 435 is deposited on the lightly doped semiconductor layer 421 by a suitable method such as imprinting.

In step 3017, an oxide layer 436 is deposited on the substrate 430 and the resist layer 435 by a suitable method such as thermal evaporation, e-beam evaporation, and sputtering. The oxide layer 436 has a thickness greater than a total thickness of the heavily doped layer 419 and the silicide layer 418.

In step 3018, remainder of the resist layer 435 and portions of the oxide layer 436 thereon are lift-off by a suitable technique such as plasma ashing and dissolution in a suitable solvent.

In step 3019, an intrinsic amorphous silicon (a-Si) layer (is deposited isotropically over the lightly doped semiconductor layer 421 and the oxide layer 436 to form the intermediate shell 431, using a suitable technique such as ALD or CVD. ALD is preferred.

In step 3020, a doped a-Si layer is deposited isotropically over the intermediate shell 431 to form the outer shell 432, using a suitable technique such as ALD or CVD. The SBUV detector 40 is then annealed in a suitable atmosphere (e.g. forming gas) at about 450° C. for about 30 minutes.

In step 3021, an oxide layer 437 (e.g. $HfO_2$, $SiO_2$, $Al_2O_3$) is deposited isotropically over the outer shell 432, using suitable technique such as ALD or CVD. The oxide layer 437 is functional to passivate surfaces of the outer shell 432.

Figure 9:
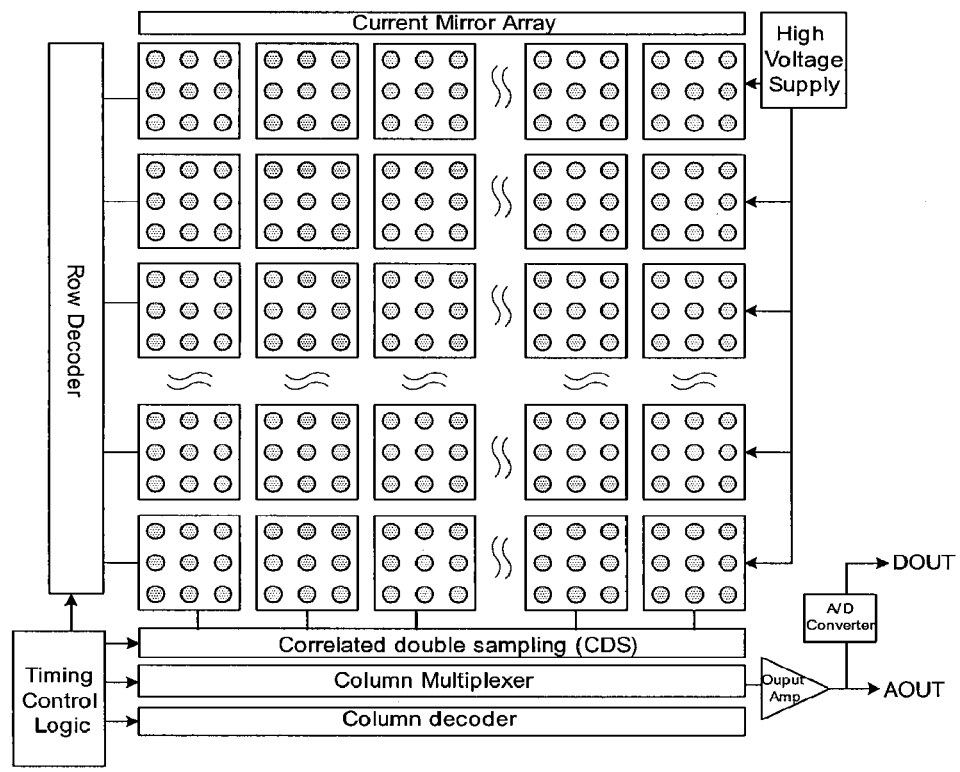
FIG. 9 shows a block diagram of a solar-blind image sensor.

According to one embodiment as shown in FIG. 9, the SBUV detector 10, 20, 30 or 40 can be integrated with electronic circuitry into a solar-blind image sensor. The electronic circuitry can include address decoders, a correlated double sampling circuit (CDS), a signal processor, a multiplexor and a high voltage supply (e.g. a DC high voltage supply capable of supplying at least 50 V, 100 V, 200 V or higher) for driving the APDs in the nanowires 100, 200, 300 or 400. The electronic circuitry is functional to detect the electrical signal generated by the nanowires 100, 200, 300 or 400.

Figure 10:
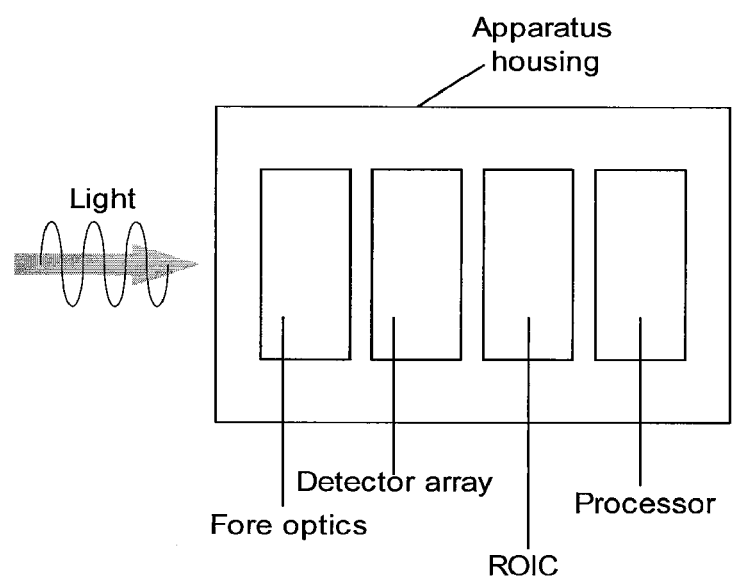
FIG. 10 shows a schematic of the SBUV detector being used as fore optics.

The SBUV detector 10, 20, 30 or 40 can also be used as fore optics in a light detector apparatus as shown in the schematic in FIG. 10.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. A device comprising:
   a substrate;
   a plurality of pixels;
   a plurality of nanowires in each of the plurality of pixel, the nanowires comprising silicon;

wherein the plurality of nanowires are configured to detect a UV emitting source without interference from solar radiation.

2. The device of claim 1, wherein the plurality of nanowires have an absorptance above 25% for UV light with a wavelength from 0.12 to 0.34 micron.

3. The device of claim 1, wherein each of the plurality of nanowires comprises a core and a cladding surrounding the core, wherein the core has a higher refractive index than the cladding.

4. The device of claim 1, wherein each of the plurality of the nanowires comprises a coupler disposed on an end of each of the nanowire away from the substrate, the coupler being functional to guide radiation into the nanowires.

5. The device of claim 1, wherein the nanowires have a height from about 0.1 µm to about 5 µm; the cladding has a thickness of about 10 nm to about 200 nm.

6. The device of claim 1, wherein the nanowires have a pitch from about 0.2 µm to about 2 µm.

7. The device of claim 1, wherein the nanowires detect UV radiation in the solar-blind UV region by converting UV radiation in the solar-blind UV region to an electrical signal.

8. The device of claim 7, wherein the device further comprises electrical components configured to detect the electrical signal.

9. The device of claim 7, wherein the device is functional to detect the electrical signal from the nanowires in different pixels separately.

10. The device of claim 1, wherein each of the nanowires comprises a photodiode or forms a photodiode with the substrate, wherein the photodiode is functional to convert at least a portion of UV radiation in the solar-blind UV region impinged on a nanowires.

11. The device of claim 10, wherein each of the nanowires comprises
   a first heavily doped semiconductor layer,
   a lightly doped semiconductor layer or an intrinsic semiconductor layer,
   a second heavily doped semiconductor layer, and
   a metal silicide layer;
   wherein the first heavily doped semiconductor layer is disposed on the lightly doped semiconductor layer or the intrinsic semiconductor layer;
   the lightly doped semiconductor layer or the intrinsic semiconductor layer is disposed on the second heavily doped semiconductor layer;
   the second heavily doped semiconductor layer is disposed on the metal silicide layer;
   the metal silicide layer is disposed on the substrate;
   the first heavily doped semiconductor layer is of an opposite type from the second heavily doped semiconductor layer; and
   wherein the first heavily doped semiconductor layer, the lightly doped semiconductor layer or the intrinsic semiconductor layer, and the second heavily doped semiconductor layer form the photodiode.

12. The device of claim 11, wherein the device further comprises a common electrode disposed on and electrically connected to ends of all the nanowires, wherein the common electrode is substantially transparent to UV radiation in a solar-blind UV region.

13. The device of claim 12, wherein the common electrode is made of graphene.

14. The device of claim 12, further comprising a metal grid on the common electrode, the metal grid configured to provide mechanical support for the common electrode.

15. The device of claim 10, wherein each of the nanowires comprises
   a core of lightly doped semiconductor,
   an intermediate shell of intrinsic semiconductor and
   an outer shell of doped semiconductor;
   wherein the intermediate shell is conformally disposed over the core;
   the outer shell is conformally disposed over the intermediate shell;
   the outer shell is of an opposite type from the core; and
   the outer shell, the intermediate shell and the core form the photodiode.

16. The device of claim 15, wherein each nanowire further comprises
   a heavily doped semiconductor layer of the same type as the core, and a metal silicide layer;
   wherein the heavily doped semiconductor layer and a metal silicide layer are sandwiched between the core and the substrate;
   the intermediate shell and the outer shell do not contact the heavily doped semiconductor layer and the metal silicide layer; and
   the metal silicide layer is in contact with the substrate and forms electrical contact to the substrate.

17. The device of claim 10, wherein the photodiode is an avalanche photodiode.

18. The device of claim 1, wherein space between the nanowires is filled with an oxide layer.

19. A solar-blind image sensor, comprising the device of claim 1 and electronic circuitry functional to detect electrical signals generated by the nanowires of the device.

20. The solar-blind image sensor of claim 19, wherein the electronic circuitry comprises a high voltage supply.

21. A method of detecting UV radiation, comprising obtaining the device of claim 1, and detecting UV radiation with the device of claim 1.

22. The method of claim 21, wherein UV radiation in a solar-blind UV region.

23. The device of claim 1, wherein the nanowires have a diameter from about 5 nm to about 30 nm.

24. A method of fabricating the device of claim 1, the method comprising:
   obtaining the plurality of nanowires and the substrate, and bonding the plurality of nanowires onto the substrate.

25. The method of claim 24, further comprising conducting lithography, ion implantation, annealing, evaporation, atomic layer deposition, chemical vapor deposition, dry etch or a combination thereof.

26. The method of claim 24, wherein the image sensor is a device or a color image sensor.

* * * * *